United States Patent
Gadzalińska et al.

(10) Patent No.: US 12,128,477 B2
(45) Date of Patent: Oct. 29, 2024

(54) ADDITIVE METHOD OF FORMING A METALLIC NANOPARTICLE MICRODOT ON A SUBSTRATE, A METALLIC NANOPARTICLE MICRODOT, AND AN ELONGATE METALLIC NANOPARTICLE FEATURE

(71) Applicant: XTPL S.A., Wrocław (PL)

(72) Inventors: Jolanta Gadzalińska, Dzialoszyn (PL); Piotr Kowalczewski, Łódź (PL); Karolina Fiączyk, Wroclaw (PL); Aneta Wiatrowska, Wroclaw (PL); Filip Granek, Wroclaw (PL)

(73) Assignee: XTPL S.A., Wroclaw (PL)

( * ) Notice: Subject to any disclaimer, the term of this patent is extended or adjusted under 35 U.S.C. 154(b) by 366 days.

(21) Appl. No.: 17/646,333

(22) Filed: Dec. 29, 2021

(65) Prior Publication Data

US 2022/0212255 A1    Jul. 7, 2022

Related U.S. Application Data

(60) Provisional application No. 63/131,725, filed on Dec. 29, 2020.

(51) Int. Cl.
*B05B 1/00* (2006.01)
*B22F 1/054* (2022.01)
(Continued)

(52) U.S. Cl.
CPC ............... *B22F 10/10* (2021.01); *B05B 1/00* (2013.01); *B22F 1/0545* (2022.01);
(Continued)

(58) Field of Classification Search
CPC ....................................................... B05B 1/00
See application file for complete search history.

(56) References Cited

U.S. PATENT DOCUMENTS

| 2014/0092158 A1* | 4/2014 | Alleyne | ................... B41J 2/125 347/14 |
| 2019/0134898 A1* | 5/2019 | Zhao | ...................... B33Y 70/10 |

FOREIGN PATENT DOCUMENTS

JP        2000042467 A  *  2/2000

OTHER PUBLICATIONS

"Strong Macroscale Supercrystalline Structures by 3D Printing Combined with Self-Assembly of Ceramic Functionalized Nanoparticles", Berta Domènech, Alvin T. L. Tan, Hans Jelitto, Adv. Eng. Mater., 22, 2000352, (Year: 2020).*
(Continued)

*Primary Examiner* — Kelly M Gambetta
*Assistant Examiner* — Mohammad Mayy
(74) *Attorney, Agent, or Firm* — K&L Gates LLP

(57) ABSTRACT

An additive method of forming a metallic nanoparticle microdot on a substrate is disclosed. The method includes: (A) estimating or obtaining a position of an outlet of a capillary tube at zero height above the substrate (zero-height position); (B) extruding a metallic nanoparticle composition from the outlet at a first height $h_1$ above the zero-height position, including forming a fluid bridge between the outlet and the substrate; (C) optionally lifting the capillary tube relative to the substrate by a height increment of Dh while continuing to extrude the metallic nanoparticle composition from the outlet; and (D) rapidly lifting the capillary tube to separate the outlet from the fluid bridge.

22 Claims, 19 Drawing Sheets

(51) Int. Cl.
  *B22F 1/0545* (2022.01)
  *B22F 1/107* (2022.01)
  *B22F 10/10* (2021.01)
  *B22F 10/32* (2021.01)
  *B33Y 10/00* (2015.01)
  *B33Y 70/10* (2020.01)
  *B33Y 80/00* (2015.01)

(52) U.S. Cl.
  CPC ............ *B22F 1/0547* (2022.01); *B22F 1/107* (2022.01); *B22F 10/32* (2021.01); *B33Y 10/00* (2014.12); *B33Y 70/10* (2020.01); *B33Y 80/00* (2014.12); *B22F 2301/10* (2013.01); *B22F 2301/255* (2013.01); *B22F 2304/05* (2013.01)

(56) References Cited

OTHER PUBLICATIONS

Neuros Syringe, Model 1710, (Year: 2019).*
Needle Gauge Chart, (Year: 2019).*

* cited by examiner

ADDITIVE METHOD OF FORMING A METALLIC NANOPARTICLE MICRODOT ON A SUBSTRATE, A METALLIC NANOPARTICLE MICRODOT, AND AN ELONGATE METALLIC NANOPARTICLE FEATURE

CROSS-REFERENCE TO RELATED APPLICATION

This application claims benefit under 35 U.S.C. § 119(e) to U.S. Provisional Application No. 63/131,725, filed Dec. 29, 2020, entitled "AN ADDITIVE METHOD OF FORMING A METALLIC NANO PARTICLE MICRODOT ON A SUBSTRATE, A METALLIC NANOPARTICLE MICRODOT, AND AN ELONGATE METALLIC NANOPARTICLE FEATURE," the entire disclosure of which is hereby incorporated by reference herein.

BACKGROUND

Various conductive features can be formed by extruding a metallic nanoparticle composition through a capillary tube onto a substrate. Conductive features include lines and microdots. Conductive features could be useful in applications such as interconnection and integration of semiconductor devices and optoelectronic devices and open defect repair (ODR). Furthermore, conductive features could be optimized to enable conformal coatings overlying them. For these and other reasons, improved methods of forming conductive features are desired.

SUMMARY OF THE INVENTION

In one aspect, an additive method of forming a metallic nanoparticle microdot on a substrate includes the following steps: (A) estimating or obtaining a position of an outlet of a capillary tube at zero height above the substrate (zero-height position); (B) extruding a metallic nanoparticle composition from the outlet at a first height $h_1$ above the zero-height position, including forming a fluid bridge between the outlet and the substrate; (C) optionally lifting the capillary tube relative to the substrate by a height increment of $\Delta h$ while continuing to extrude the metallic nanoparticle composition from the outlet; and (D) rapidly lifting the capillary tube to separate the outlet from the fluid bridge.

In another aspect, a metallic nanoparticle microdot on a substrate includes metallic nanoparticles bounded by a substrate surface and a curved surface intersecting the substrate surface. The substrate extends principally along an X-axis and a Y-axis perpendicular to the X-axis. The curved surface protrudes away from the substrate along a Z-axis perpendicular to the X-axis and to the Y-axis. The curved surface includes a peak and a curved line traversing the peak and extending along the X-axis and the Z-axis. The curved line is approximated by a parabolic function of a form: $z=ax^2+bx+c$, where x is displacement along the X-axis, z is displacement along the Z-axis, and a, b, and c are respective constants. A correlation of the parabolic function to the curved line is characterized by a coefficient of determination $R^2$, where $R^2$ is in a range of 0.95 to 1.0.

In yet another aspect, an elongate metallic nanoparticle feature on a substrate includes metallic nanoparticles bounded by a substrate surface and a curved surface intersecting the substrate surface. The substrate extends principally along an X-axis and a Y-axis perpendicular to the X-axis. The curved surface extends longitudinally along the Y-axis and protrudes along a Z-axis perpendicular to the X-axis and to the Y-axis. The curved surface includes a curved line extending along the X-axis and the Z-axis. The curved line is approximated by a parabolic function of a form: $z=ax^2+bx+c$, where x is displacement along the X-axis, z is displacement along the Z-axis, and a, b, and c are respective constants. A correlation of the parabolic function to the curved line is characterized by a coefficient of determination $R^2$, where $R^2$ is in a range of 0.95 to 1.0.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to an additive method of forming a metallic nanoparticle microdot on a substrate, a metallic nanoparticle microdot, and an elongate metallic nanoparticle feature.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
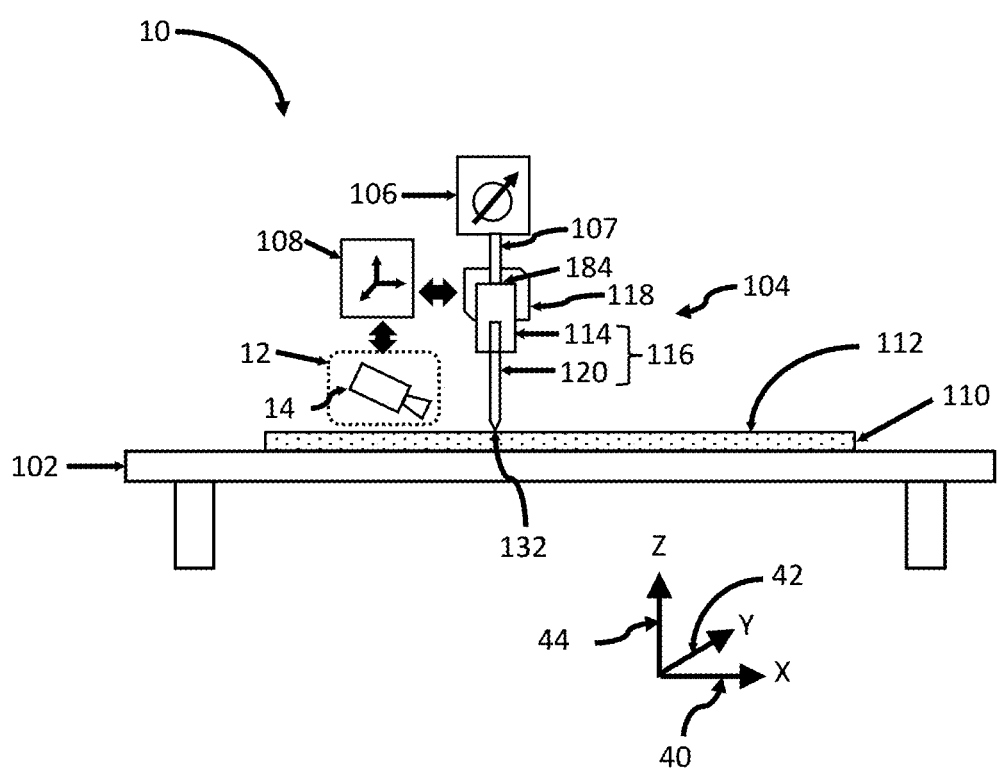
FIG. 1 is a schematic block diagram view of an illustrative nanoparticle composition printing apparatus.

In carrying out additive methods of forming a metallic nanoparticle microdot or an elongate metallic nanoparticle feature on a substrate, a printing apparatus is typically used. FIG. 1 is a schematic block diagram view of an illustrative printing apparatus 10. The printing apparatus 10 includes a substrate stage 102, a print head 104, a regulated pneumatic system 106, and a print head positioning system 108. A substrate 110 is fixed in position on the substrate stage 102 during the printing (dispensing) and has a printable surface 112, which is facing upward and facing towards the print head 104. The print head 104 is positioned above the substrate 110. The print head 104 includes a metallic nanoparticle composition dispenser 116 and a cartridge holder (dispenser holder) 118. The metallic nanoparticle composition dispenser 116 includes a piston-cylinder assembly 114 and a capillary tube 120, as described with reference to FIG. 10. Typically, the regulated pneumatic system 106 includes a pump and a pressure regulator. In the example shown in FIGS. 1, 2, and 3, a pneumatic port 184 of the piston cylinder assembly 114 is coupled to the regulated pneumatic system 106 via tubing 107. Preferably, the regulated pneumatic system 106 is capable of applying pressure in a range of 0 bar to 10 bar to the pneumatic port 184.

The print head positioning system 108 controls the vertical displacement (along Z-axis direction 44) of the print head 104 and the lateral displacement (along X-axis direction 40 and/or Y-axis direction 42) of the print head 104 relative to the substrate. During dispensing of the metallic nanoparticle composition onto the substrate, the print head 104 is moved laterally and/or vertically.

Figure 9:
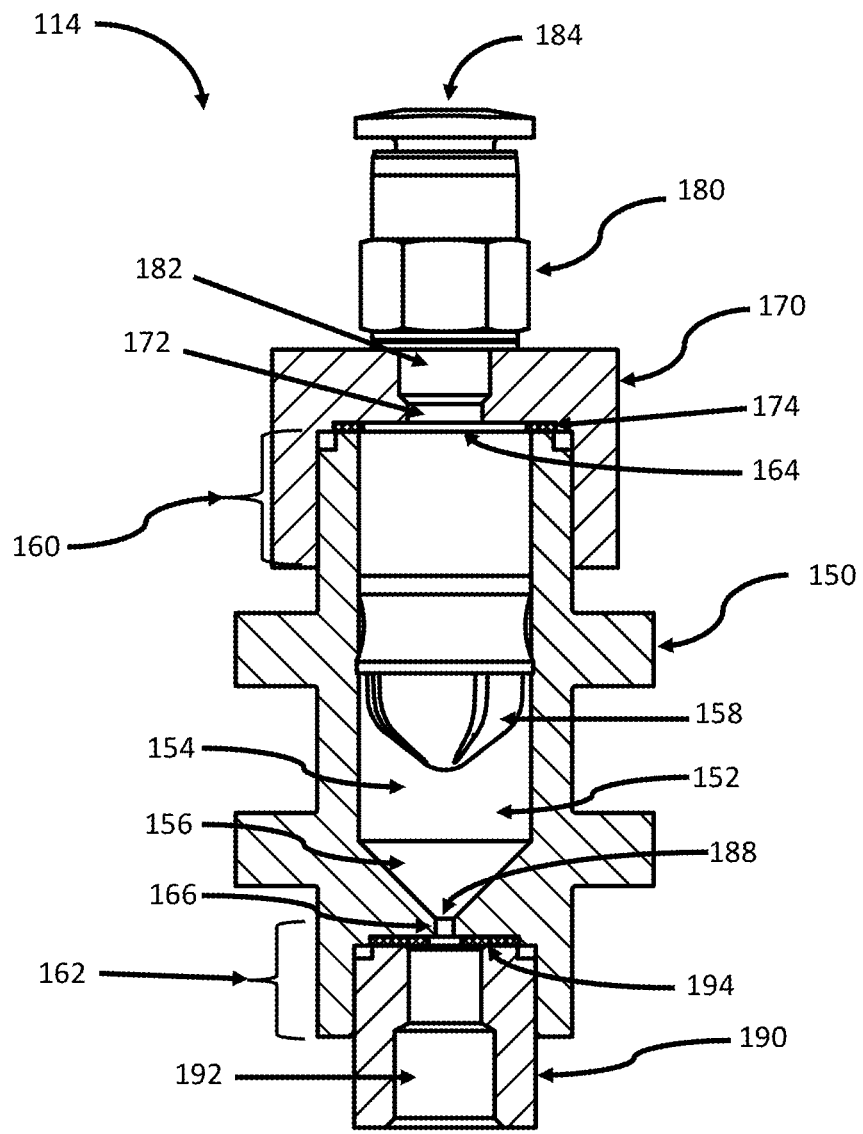
FIG. 9 is a schematic side view and partial cross-sectional view of a piston-cylinder assembly.

The piston-cylinder assembly 114 is sometimes referred to as a printer cartridge. A schematic side view and partial cross-sectional view of an exemplary piston-cylinder assembly 114 is shown in FIG. 9. In the example shown, the piston-cylinder assembly 114 includes a cylinder 150, a cylinder cover 170, a pneumatic connector 180, and an intermediate sealing sleeve 190. The cylinder 150 is shown in cross-section to show a cylindrical cavity portion 154 and a conical cavity portion 156. A piston 158 is located inside cylinder 150. The cylinder 150 has a first end (top end) portion 160 and a second end (bottom end) portion 162 opposite the first end. The cylinder cover 170 is sealably mated to the cylinder 150 at the first end portion 160. In the example shown, an interior surface of the cylinder cover 170 and an exterior surface of the cylinder 150 at its first end portion 160 form a threaded joint. A flat gasket 174 is under compression between the cylinder cover 170 and the cylinder 150 and forms a seal. The intermediate sealing sleeve 190 is sealably mated to the cylinder 150 at the second end portion 162. In the example shown, an exterior surface of the intermediate sealing sleeve 190 and an interior surface of the cylinder 150 at its second end portion 162 form a threaded joint. A flat gasket 194 is under compression between the intermediate sealing sleeve 190 and the cylinder 150 and forms a seal.

The cylinder cover 170 has an opening 172, which retains the pneumatic connector 180. A pneumatic port 184 extends longitudinally through the pneumatic connector 180. The cylinder 150 has a first end 164, in the first end portion 160, and a second end 166, in the second end portion 162. Accordingly, the pneumatic port is at the first end of the cylinder. Air or fluid enters the cylinder from the pneumatic port 184. Inside the cylinder, air or fluid first travels through the cylindrical cavity portion 154 and then a conical cavity portion 156, which tapers to an outlet port 188 at its apex. The outlet port 188 is at the second end 166 opposite the first end 164. The piston 158 is movable in the cylinder 150 between the first end 164 and the second end 166.

Figure 4:
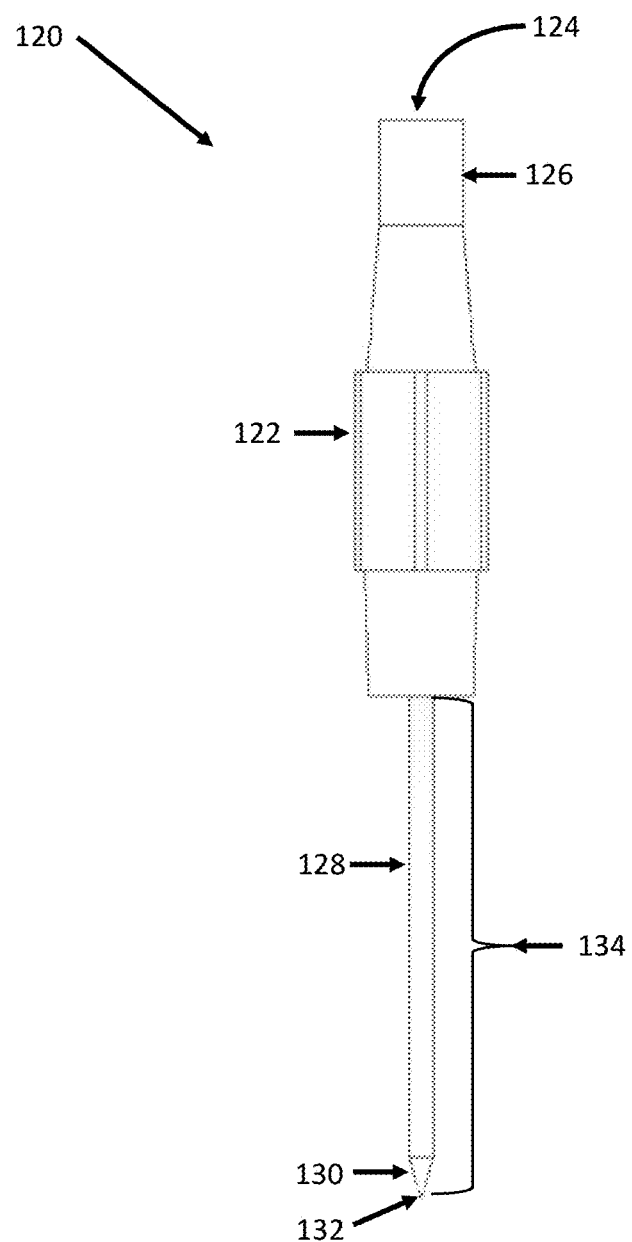
FIG. 4 is a schematic side view of a glass capillary tube.
Figure 10:
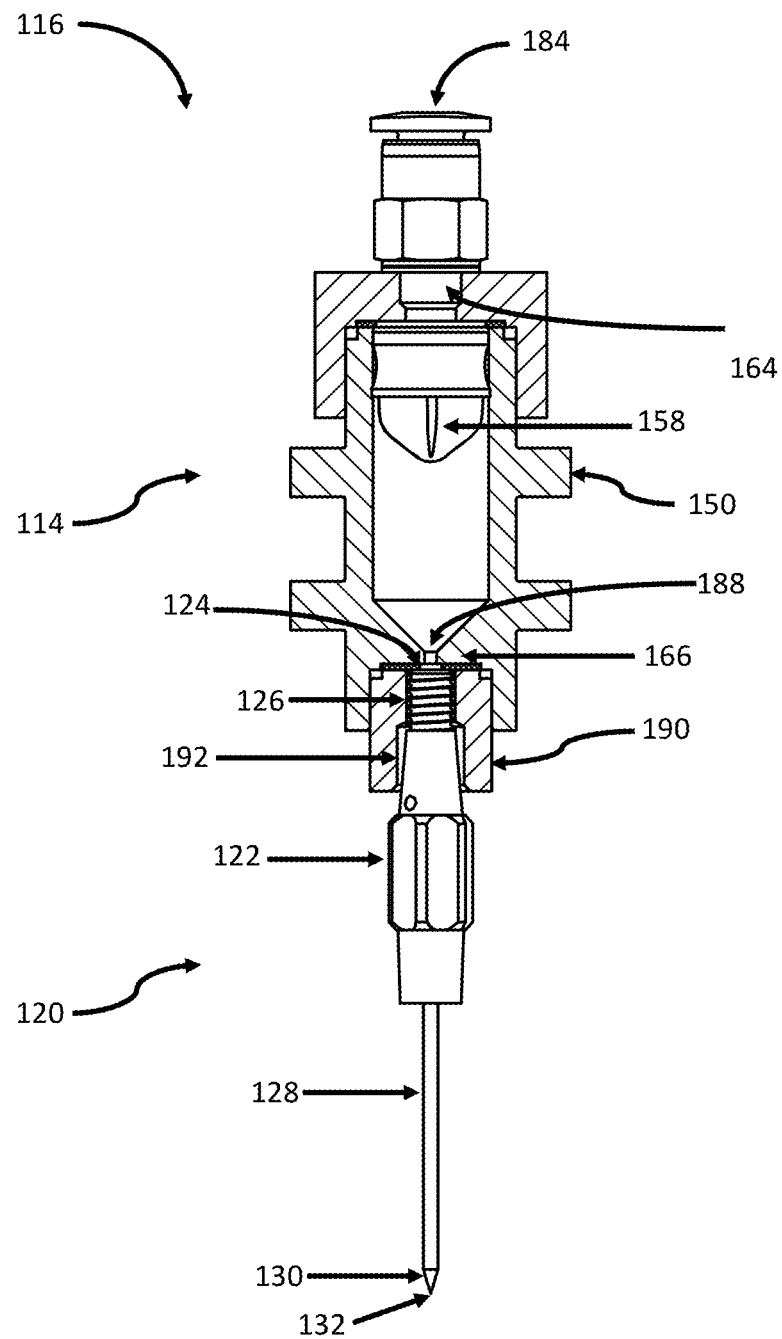
FIG. 10 is a schematic side view and partial cross-sectional view of a metallic nanoparticle composition dispenser.

FIG. 10 is a schematic side view and partial cross-sectional view of a dispenser 116. The dispenser 116 includes a piston-cylinder assembly 114 (FIG. 9) and a capillary tube (nozzle) 120. Capillary tube 120 has a tube inlet 124 and a tube outlet 132. Capillary tube 120 is described in greater detail with reference to FIG. 4. In the example shown, there is a handle 122, including a threaded portion 126, attached to the capillary tube. The threaded portion 126 and an interior surface 192 of the intermediate sealing sleeve 190 form a threaded joint. Accordingly, the intermediate sealing sleeve retains the handle that is attached to the capillary tube. The tube inlet 124 of capillary tube 120 is coupled to the outlet port 188 at the second end 166 of the cylinder 150. A capillary tube 120 is installed in the piston-cylinder assembly 114, to form a dispenser 116. The dispenser is particularly suited to dispense metallic nanoparticle compositions described herein. Accordingly, the dispenser is sometimes referred to as a metallic nanoparticle composition dispenser.

Commercially available glass capillary tubes can be used in the dispenser. For example, glass capillary tubes (Eppendorf™ Femtotips™ II Microinjection Capillary Tips), having an inner diameter at the tip of 0.5 µm and an outer diameter at the tip of 0.7 µm, are available from Fisher Scientific. A commercially available glass capillary tube 120 is shown schematically in FIG. 4. The glass capillary tube has an inlet 124 at a first end, and outlet 132 at a second end opposite the first end, and an elongate fluid passageway between the inlet 124 and outlet 132. A plastic handle 122 is attached to the glass capillary tube 120 around its circumference. The plastic handle 122 includes an inlet (input end) 124 and a threaded portion 126 near the inlet 124 which enables a threaded connection to an external body or external conduit (see FIG. 10). The inlet 124 has an inner diameter of 1.2 mm.

Figures 5, 6:
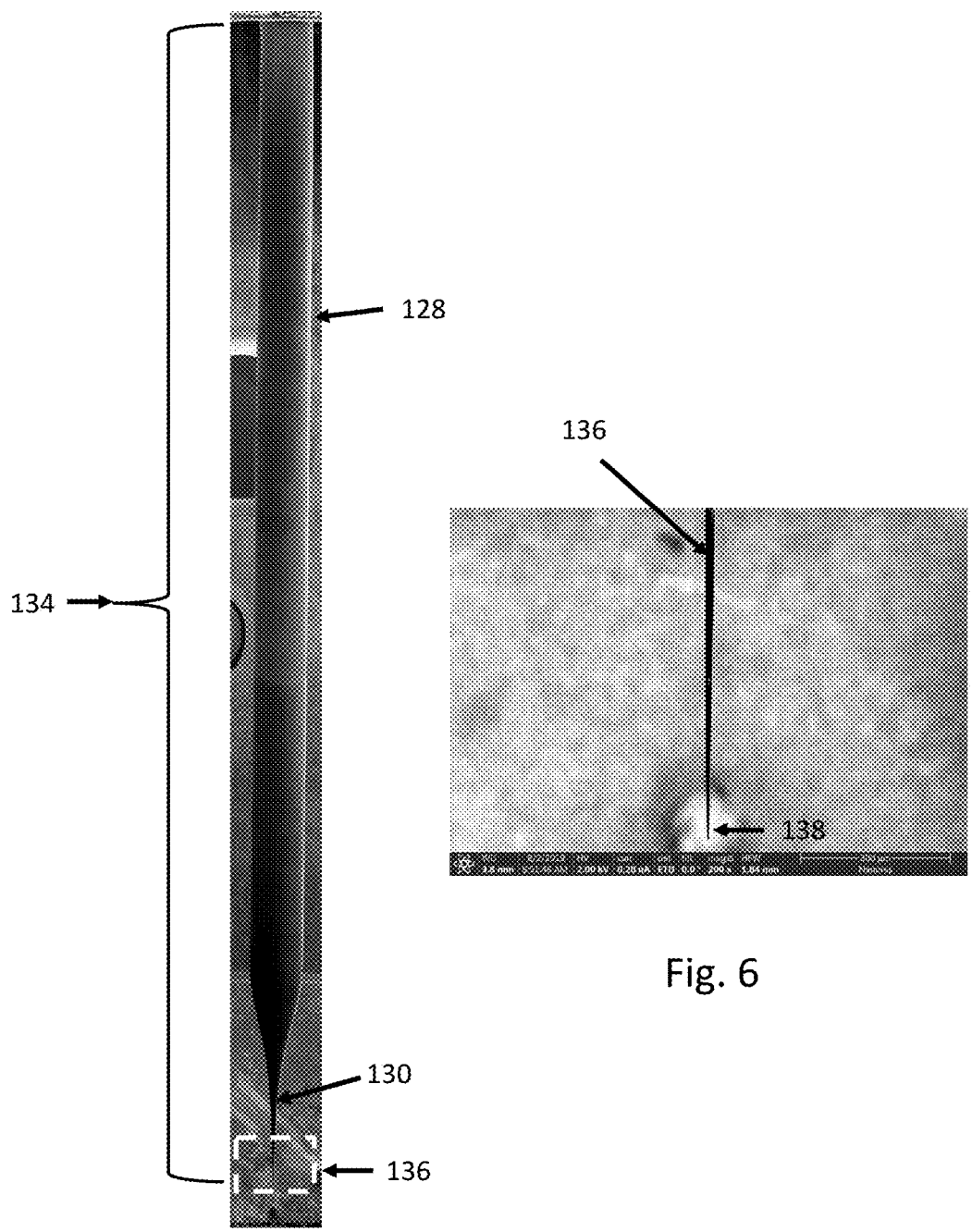
FIG. 5 is a scanning electron microscope (SEM) view of a portion of a glass capillary tube.
FIG. 6 is a scanning electron microscope (SEM) view of a tapering portion of the glass capillary tube, under low magnification.
Figure 7:
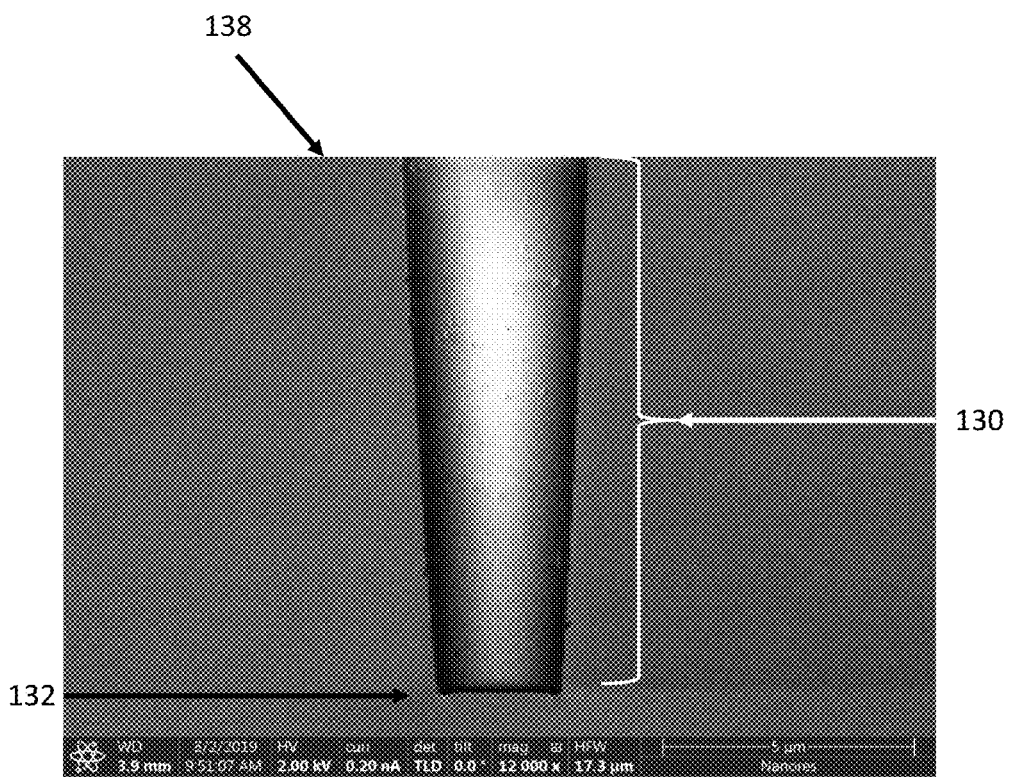
FIG. 7 is a scanning electron microscope (SEM) view of a tapering portion of the glass capillary tube, under high magnification.

The glass capillary tube includes an elongate input portion 128 and a tapering portion 130. There is an externally visible portion 134 of the glass capillary tube 120. Some of the elongate input portion 128 may be obscured by the surrounding plastic handle 122. The tapering portion 130 tapers to an outlet (output end) 132 (having an inner diameter of 0.5 µm and an outer diameter at the tip of 0.7 µm in the case of the certain Femtotips™ II Microinjection Capillary Tips). Stainless-steel capillary tubes can also be used. The reduction of diameter along the tapering portion 130 from the elongate input portion 128 to the outlet 132 is more clearly illustrated in FIGS. 5 through 7. FIG. 5 is a scanning electron micrograph view (formed from stitching together multiple SEM images) of the entire externally visible portion 134 of the glass capillary tube 120. A first magnification region 136 of the tapering portion 130 including the outlet 132, observed under low magnification in a scanning electron microscope (SEM), is shown in FIG. 6. Furthermore, a second magnification region 138 located within the first magnification region 136, observed under high magnification in a scanning electron microscope (SEM), is shown in FIG. 7. The outer diameter is smallest at the outlet 132 (FIG. 7) and increases with increasing longitudinal distance from the outlet 132.

Figure 8:
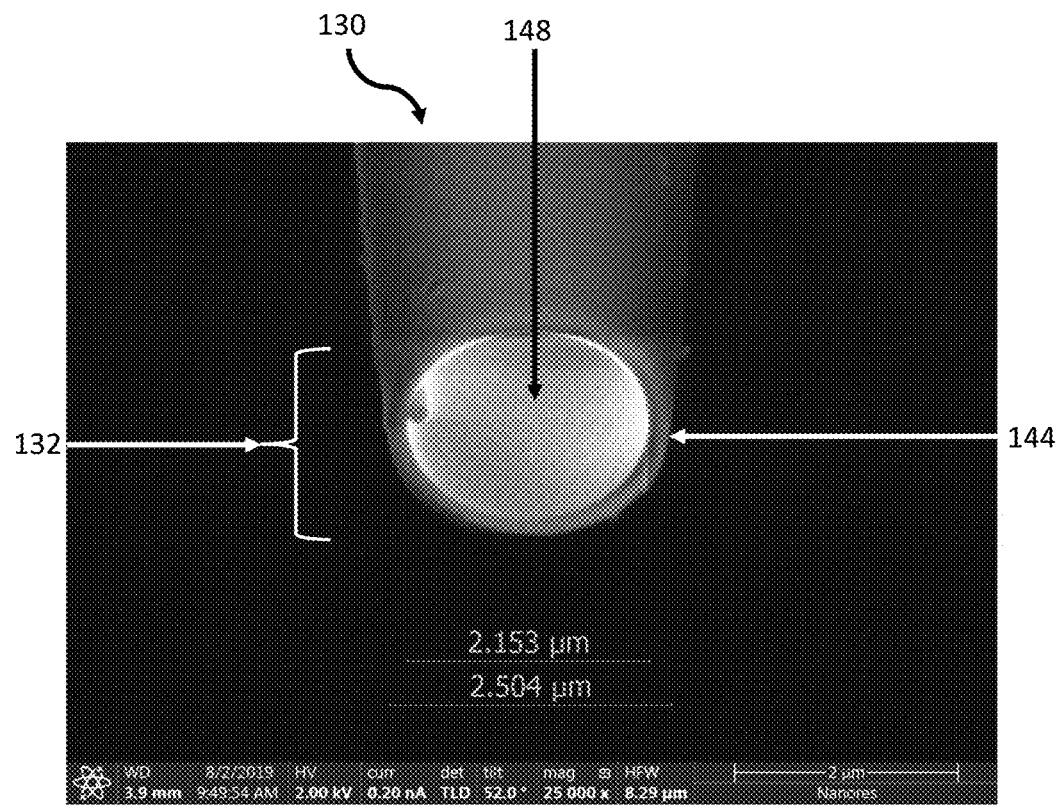
FIG. 8 is a scanning electron microscope (SEM) view of the output portion after focused-ion beam treatment, under high magnification.

In many cases it is desirable to increase the size of the outlet (outlet size). It is possible to increase the outlet size by cutting the glass capillary tube 120 at a suitable longitudinal location along the tapering portion 130. Cutting may be done using a focused-ion beam (FIB) apparatus. For example, a plasma-source Xe$^+$ FIB (also called PFIB) is used. The capillary tube is installed in the FIB apparatus. A longitudinal location along the tapering portion 130 is selected, and the focused ion beam is directed to it, with sufficient energy density for cutting the glass tube. A cut is made using the focused-ion beam across the tapering portion at the selected longitudinal location. A scanning electron microscope (in the FIB apparatus) is used to measure the outer diameter or inner diameter or both at the tip. If the measured inner diameter or outer diameter or both are too small, the cutting is carried out at another longitudinal location along the tapering portion. In the example shown in FIG. 8, the outlet inner diameter is measured to be 2.153 µm and the outlet outer diameter is measured to be 2.504 µm. We refer to the outlet outer diameter as the outlet size. For glass capillary tubes 120, outlet sizes in a range of 0.7 µm to 8 µm are possible and have been tried.

In preparing a printing apparatus for use, a metallic nanoparticle composition is injected into the cylinder 150. In the case of the piston-cylinder assembly shown in FIG. 9, this can be accomplished by injecting the metallic nanoparticle composition into the cylinder 150 via its first end 164 using a syringe, with the piston 158 removed from the cylinder and the cover 170 and the pneumatic connector 180 detached from the cylinder 150. Subsequently, the piston is positioned in the cylinder. Additionally, in the example shown in FIG. 9, the cylinder cover 170 and the pneumatic connector 180 are attached to the cylinder 150. The pneumatic port 184 is coupled to a regulated pneumatic system 106 via tubing 107.

Figure 11:
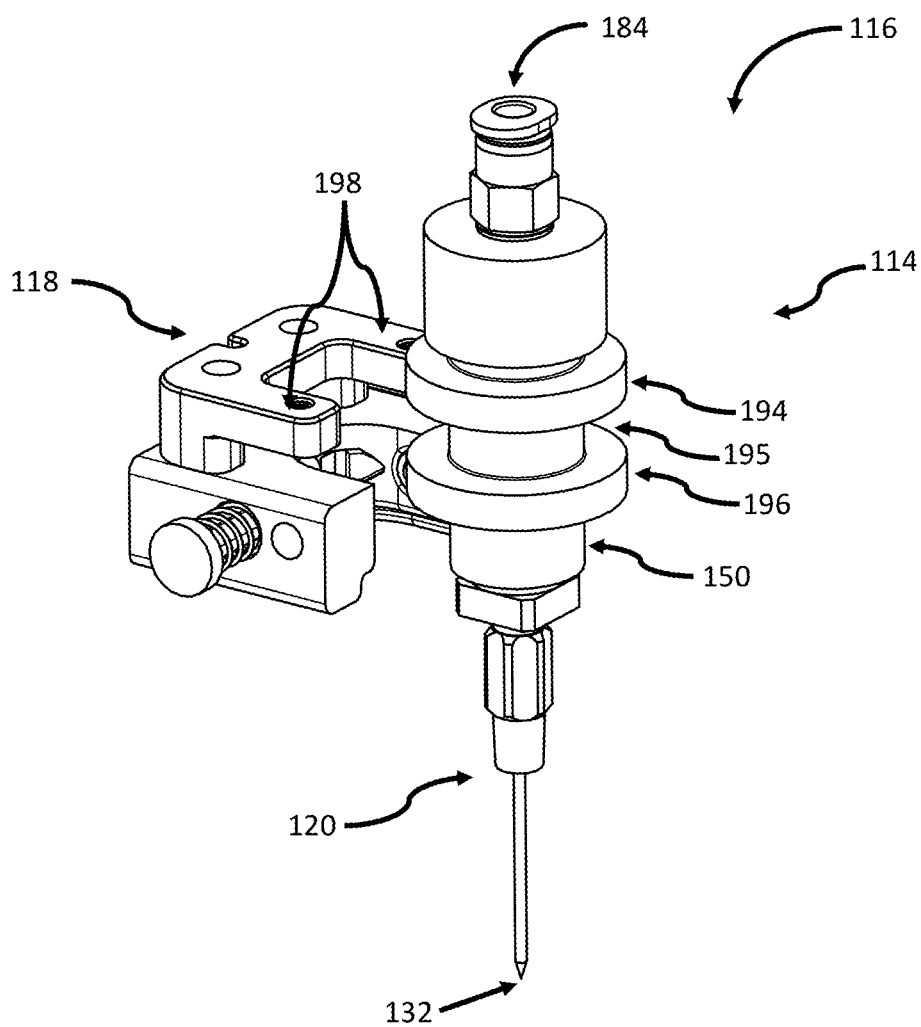
FIG. 11 is a schematic perspective view of a metallic nanoparticle composition dispenser and an associated dispenser holder.

FIG. 11 is a schematic perspective view of a metallic nanoparticle composition dispenser 116 and an associated dispenser holder 118. The dispenser holder 118 includes a fork 198. When assembled, the fork is inserted into a groove 195 between two annular protrusions 194, 196 that protrude radially outward from the outer walls of the cylinder 150. Accordingly, the dispenser holder 118 retains the dispenser. The dispenser holder 118 is mechanically coupled to the print head positioning system 108. In preparing a printing apparatus for use, the dispenser 116 is installed in the dispenser holder 118.

Figure 2:
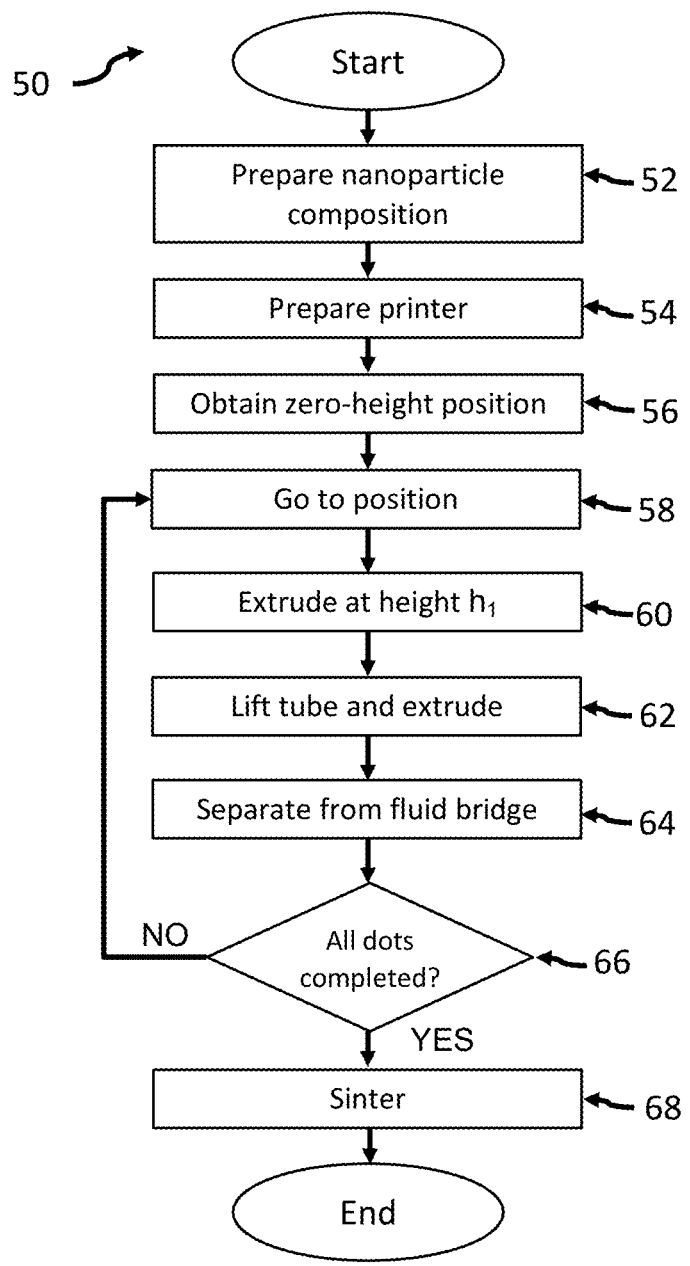
FIG. 2 is a flow diagram of an additive method of forming a metallic nanoparticle microdot on a substrate.
Figure 3:
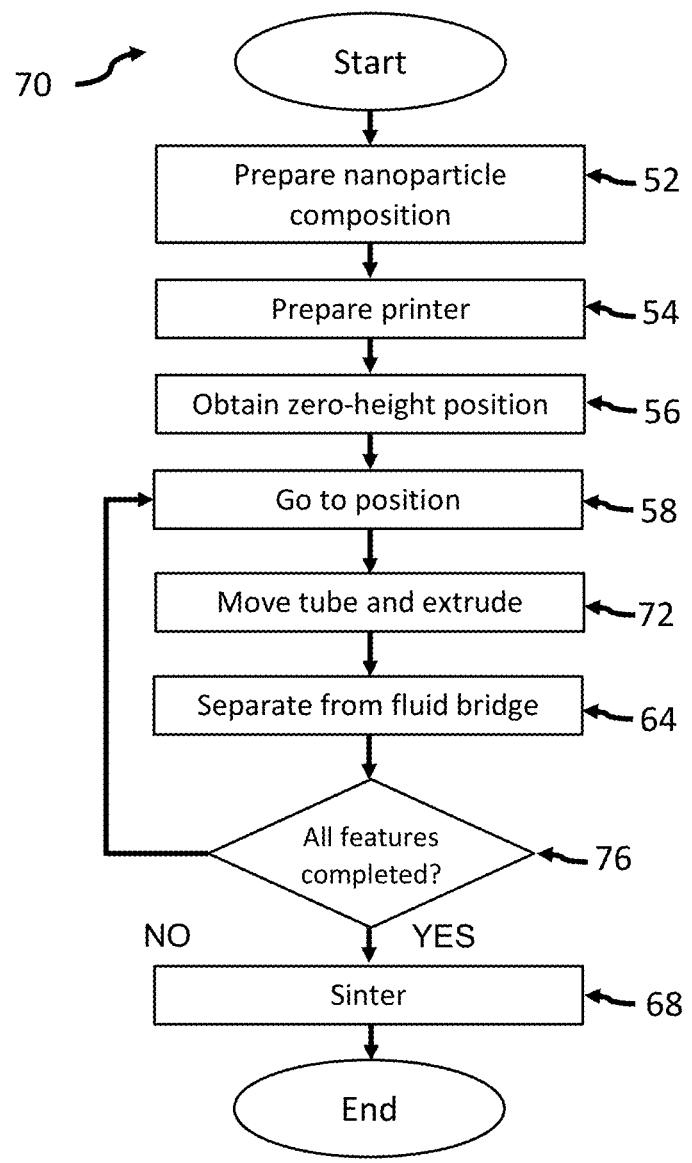
FIG. 3 is a flow diagram of an additive method of forming an elongate metallic nanoparticle feature on a substrate.

The nanoparticle composition printing apparatus 10 (FIG. 1) is used to carry out an additive method of forming a metallic nanoparticle microdot on a substrate (method 50 of FIG. 2) or an additive method of forming an elongate metallic nanoparticle feature on a substrate (method 70 of FIG. 3). The printing apparatus 10 includes an imaging system 12, which includes a camera 14. In addition to the camera 14, the imaging system 12 may include image processing software resident on a computer, with the computer being coupled to the camera 14. The imaging system 12 is coupled to the positioning system 108. The positioning system 108 controls the positioning of the nanoparticle composition dispenser 116 and the camera 14. Preferably, the position of the camera 14, including its orientation, is adjusted as needed such that the capillary tube 120 and a portion of the substrate 110 near the capillary tube 120 are within the field-of-view of the camera 14.

Method 50 (FIG. 2) includes steps 52, 54, 56, 58, 60, 62, 64, 66, and 68. At step 52, a metallic nanoparticle composition is prepared. This includes synthesizing metallic nanoparticles unless metallic nanoparticles are already available. Generally, the synthesis of metallic nanoparticles in solution employs three components: (1) metal precursors (e.g., AgNO3 for silver nanoparticles and Cu(NO3)2 for copper nanoparticles); (2) reducing agents (e.g., ethylene glycol for silver nanoparticles and sodium hypophosphite for copper nanoparticles); and (3) stabilizing (capping) agents (e.g., polyvinylpyrrolidone). Polyvinylpyrrolidone, abbreviated as PVP, is soluble in water and other polar solvents. When PVP is effectively used as a dispersant, stable colloidal silver nanoparticles or copper nanoparticles covered (capped) with PVP polymer can be obtained in small size (<250 nm) because the PVP reduces the aggregation of the silver or copper nanoparticles.

The average size of the silver nanoparticles can be controlled to within a range of 20 nm to 80 nm. The average size of the copper nanoparticles can be controlled to within a range of 60 nm to 160 nm. The average particle size and dispersity can be controlled by controlling thermodynamic and kinetic reaction parameters. Reaction temperature, temperature ramp, and reaction time are the important thermodynamic reaction parameters. The rate of adding reagents and molar ratio of used metal precursor to stabilizing agent (PVP) are the important kinetic reaction parameters. An appropriate combination of these parameters leads to obtaining nanoparticles that exhibit the desired properties of small particles size, low dispersity, and high dispersion stability (low occurrence of aggregation).

Furthermore, at step 52, a metallic nanoparticle composition is made from the metallic nanoparticles. Generally, the nanoparticles are separated, to remove impurities and excess PVP, and dispersed in a solvent mixture including a first solvent and an optional second solvent. The metallic nanoparticle composition may optionally include additives to better control its physicochemical properties. These additives include surfactants, binders, adhesion promoters, and antifoaming agents. We have found that the concentration of such additives should not exceed 3% by weight in the metallic nanoparticle composition.

The preparation of an example composition is described in detail in the Example 1 hereinbelow. The Example 1 composition contains silver nanoparticles and triethylene glycol as a solvent. It has been found that solvents having a boiling point of at least 280° C. at a pressure of 760 mm Hg are preferable. It has been found that non-aqueous polar protic solvents having two hydroxyl groups are preferable. It has been found that solvents having a viscosity in a range of 45 cP to 65 cP at 20° C. are preferable. Triethylene glycol and tetraethylene glycol are non-aqueous polar protic solvents having two hydroxyl groups. Triethylene glycol has a boiling point of 288.0° C. at a pressure of 760 mm Hg and a viscosity of 49.0 cP at 20° C. Tetraethylene glycol has a boiling point of 329.7° C. (decomposes) at a pressure of 760 mm Hg and a viscosity of 58.3 cP at 20° C. It has been found that triethylene glycol and tetraethylene glycol are preferable as solvents. On the other hand, it is preferable to reduce or avoid the use of lower-boiling point solvents having a boiling point of less than 280° C. at a pressure of 760 mm Hg. Examples of such lower-boiling point solvents are water, methanol, and ethanol. In a preferred metallic nanoparticle composition, a concentration, in aggregate, of solvents having a boiling point of less than 280° C. at a pressure of 760 mm Hg in the metallic nanoparticle composition does not exceed 3 wt %. In a preferred metallic nanoparticle composition, a concentration of metals (this can be estimated by estimating the concentration of metallic nanoparticles excluding the PVP capping layer) in the metallic nanoparticle composition is in a range of 60 wt % to 90 wt %, or in a range of 76 wt % to 84 wt %. In the Example 1 composition, the concentration of silver nanoparticles solids is approximately 85 wt %, and a concentration of silver is estimated to be in a range of 79 wt % to 83 wt %.

At step 54, a printing apparatus (printer) is prepared for use. An example printer 10 has been described with reference to FIG. 1. Step 54 can also include preparing a capillary tube 120 (FIGS. 4, 5, 6, 7, and 8), a piston-cylinder assembly (printer cartridge) 114 (FIG. 9), a dispenser 116 including the capillary tube 120 and the printer cartridge 114 (FIGS. 10, 11). At step 54, the metallic nanoparticle composition can be injected into the cylinder 150. At step 54, the nanoparticle composition dispenser 116, which includes the capillary tube 120, is positioned above the substrate 110, and the capillary tube is oriented such that its outlet points toward the substrate.

Figure 12:
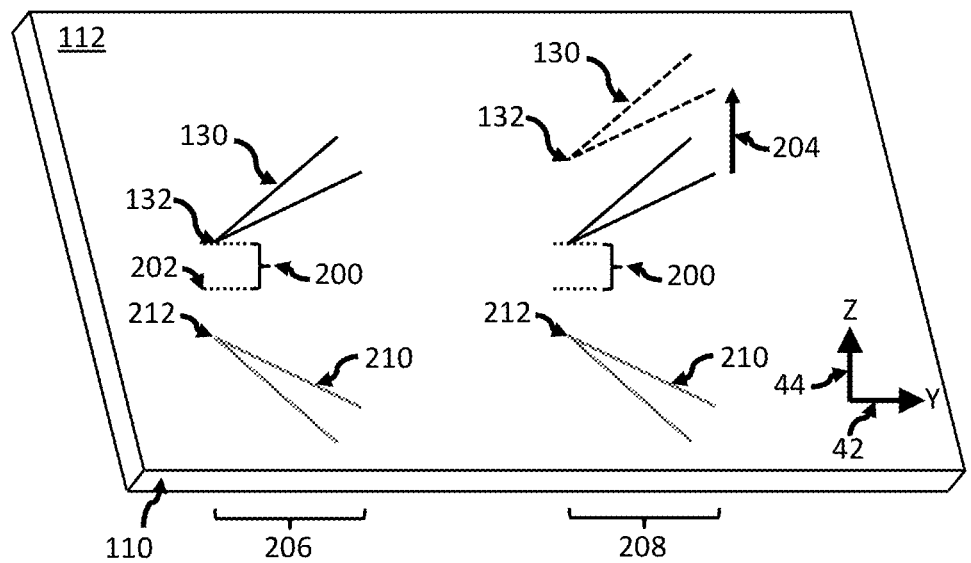
FIG. 12 is a schematic perspective view of an implementation of an additive method of forming a metallic nanoparticle microdot on a substrate.

At step 56, a position of the outlet 132 of the capillary tube 120 at zero height above the substrate is estimated or obtained. This position is referred to as the zero-height position. FIG. 12 shows two schematic perspective views (206, 208) of the tapering portion 130 and the outlet 132 of a capillary tube, suspended above a substrate 110. The two views 206, 208 correspond to different times. For ease of illustration, only a small portion of the tapering portion is shown. In this implementation, the tapering portion 130 (the capillary tube 120) is tilted at an oblique angle relative to a vertical axis (Z-axis 44). In view 206, the outlet 132 (tip of the capillary tube) is at a height 200 above zero-height position 202. The imaging system 12 can be used to estimate or obtain the zero-height position. In this case, a reflection 210 of the tapering portion 130, including a reflection 212 of the outlet 132, from the substrate's printable surface 112 is visible. For example, the imaging system 12 could estimate a midpoint between outlet 132 and its reflection 212 to be the zero-height position or could discern a position of the printable surface 112 of the substrate 110 and determine this position to be the zero-height position.

At step 58, the capillary tube 120 (more specifically, the outlet 132) is displaced to a start position. The start position is a lateral position, typically expressed in coordinates along the substrate plane (along X-axis 40 and Y-axis 42), at which the metallic nanoparticle microdot is to be formed. At step 60, the metallic nanoparticle composition is extruded from the outlet at a first height h1 above the zero-height position. For example, view 206 (FIG. 12) can be regarded as a view of the outlet 132 at a first height h1 above the zero-height position if height 200 is equal to first height h1. This step 60 includes forming a fluid bridge (a bridge of the metallic nanoparticle composition) between the outlet 132 and the substrate 110. Accordingly, the first height h1 should be chosen to be sufficiently short such that a fluid bridge spanning the outlet 132 and the substrate 110 can be formed. Under typical conditions, the first height h1 can be in a range of 1 μm to 10 μm. The metallic nanoparticle composition is extruded from the outlet under a pressure applied to the metallic nanoparticle composition. In the example shown in FIGS. 1 and 9, the regulated pneumatic system 106 applies pressure to the pneumatic port 184 of the dispenser 116. The pressure applied to the metallic nanoparticle composition in the dispenser is preferably in a range of 0 bar to 10 bar. No electric fields need to be applied to the nanoparticle composition to carry out this extrusion. At step 60, the extrusion can be carried out for a predetermined time.

Step 62 is an optional step and is illustrated in view 208 of FIG. 12. At step 62, the capillary tube is lifted relative to the substrate (along Z-axis 44) by a height increment Δh (204) while continuing to extrude the metallic nanoparticle composition from the outlet. At step 62, it is preferably that the fluid bridge remains intact while the capillary tube is lifted. Accordingly, at step 62, it is preferably to lift the capillary tube slowly enough that the fluid bridge remains intact. At step 62, the outlet reaches a height of $h^1+\Delta h$. At step 62, extrusion of the metallic nanoparticle composition can continue after the outlet reaches a height of h1+Δh. Under typical conditions, the height increment Δh can be in a range of 1 μm to 15 μm. It is also possible to repeat step 62. For example, at a second iteration of step 62, the outlet would reach a height of $h^1+2\Delta h$ and at a third iteration of step 62, the outlet would reach a height of $h^1+3\Delta h$.

At step 64, the capillary tube is rapidly lifted to separate the outlet from the fluid bridge. The extrusion of metallic nanoparticle composition to the microdot is complete upon the separation of the outlet from the fluid bridge. Steps 58, 60, 62, and 64 are repeated until all of the desired microdots have been formed on the substrate (decision step 66).

At step 68, the workpiece is sintered. The workpiece includes the substrate, the microdots, and any other features (including elongate metallic nanoparticle features, discussed hereinbelow) on the substrate. The workpiece can be sintered in an atmosphere of air or in a protective atmosphere. Examples of protective atmospheres are: Argon, Nitrogen, and a mixture of Hydrogen (5 vol. %) and Nitrogen (95 vol. %). For example, the workpiece can be sintered at a temperature of 140° C. or lower. Photonic sintering can also be used. Photonic sintering can be carried out using a laser or a flash lamp. If a laser is used, emission wavelengths of 1064 nm, 532 nm, and 450 nm have been effective. The laser can be operated in continuous-wave mode or pulsed mode.

Figure 14:
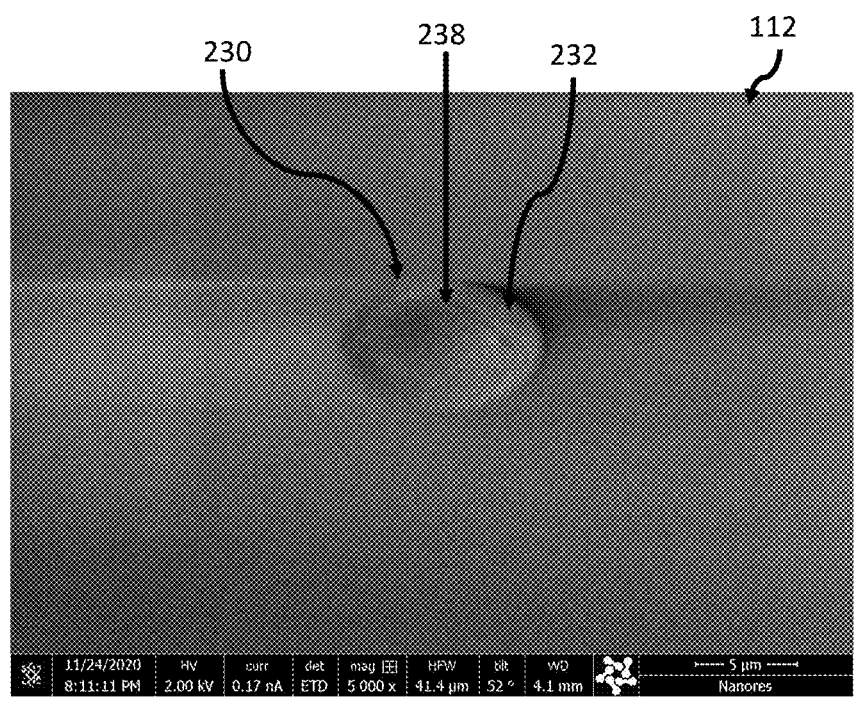
FIG. 14 is an SEM image of a first metallic nanoparticle microdot.

FIG. 14 is an SEM image of a metallic nanoparticle microdot 230, formed from the silver nanoparticle composition of Example 1. Microdot 230 has been formed on printable surface 112 of substrate 110. In this example, the substrate 110 is a bare glass substrate. In general, the substrate need not be a bare substrate. In other examples, the substrate can include a bare substrate and a thin-film coating on the bare substrate. In other examples, the substrate can include other previously existing features (e.g., conductive traces, transistors, light-emitting diodes, organic light-emitting diodes) on a bare substrate. Microdot 230 is bounded below by the printable surface 112 and bounded above by a curved surface 232. Curved surface 232 has a peak 238.

Method 50 was used to form microdot 230, with the optional step 62 omitted (no lifting of the capillary tube relative to the substrate by a height increment of Δh while continuing to extrude the metallic nanoparticle composition from the outlet). The following conditions were used: capillary tube outlet outer diameter: 3.5 μm, pressure applied to the metallic nanoparticle composition: 9 bar, first height $h^1$ above the zero-height position: 5 μm, and time duration of extrusion at step 60: 10 sec.

Figure 15:
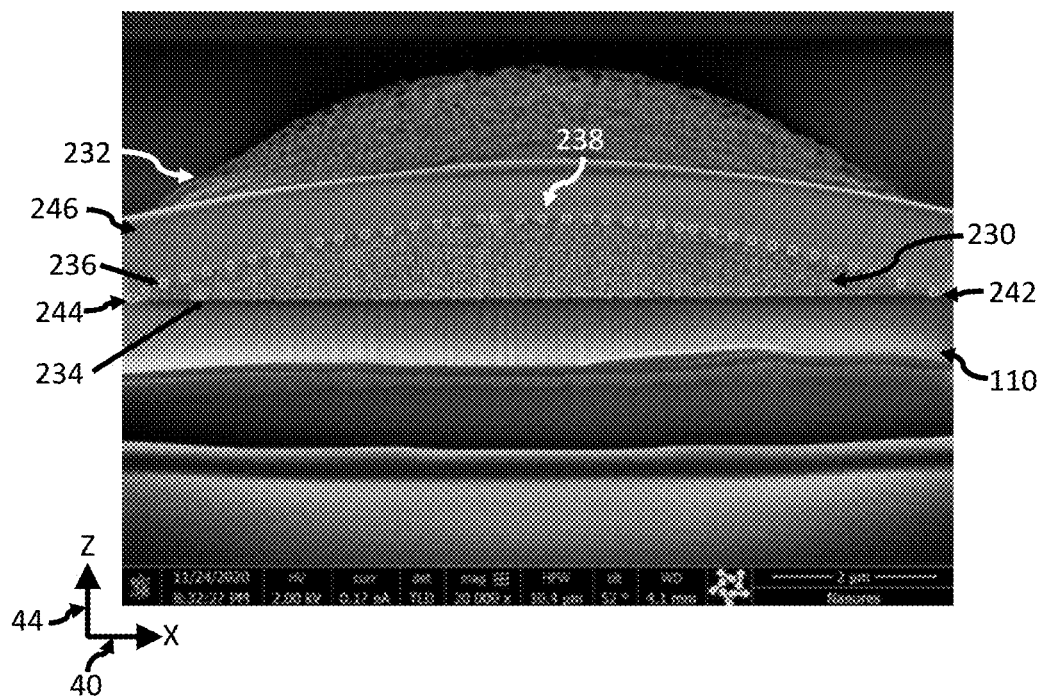
FIG. 15 is an SEM image of a cross section of the first metallic nanoparticle microdot of FIG. 14.

FIG. 15 is an SEM image of a cross section of the metallic nanoparticle microdot 230. Microdot 230 has been formed on substrate 110, which is a glass substrate in this example. The substrate extends principally along an X-axis 40 and a Y-axis perpendicular to the X-axis. In this example, this means that a major surface of the substrate extends along the X-axis and the Y-axis, while the substrate has a thickness along a Z-axis 44 perpendicular to the X-axis 40 and Y-axis. The curved surface 232 protrudes away from the substrate along the Z-axis 44. The cross section has been chosen to include the peak 238 of the curved surface 232. In the cross-sectional image of FIG. 15, a line 234 contained in the substrate surface 112 and a curved line 236 contained in the curved surface 232 are visible. The curved line 236 traverses the peak 238. The X-axis 40 and the Y-axis have been chosen such that the curved line 236 extends along the X-axis and the Z-axis. In the background of the image of FIG. 15, a portion of the curved surface 232 is visible. There is a platinum layer 246 that was formed on top of the curved surface 232 in preparing the cross-sectional sample. Accordingly, the platinum layer is not part of the microdot 230. Curved line 236 has been marked by circular marks that are used in a curve-fit shown in FIG. 16. The curved surface 232 intersects the substrate surface 112 (FIG. 14). The curved line 236 intersects the substrate surface 112 (substrate line 234) at endpoints 242 and 244 (FIGS. 15, 16).

Figure 16:
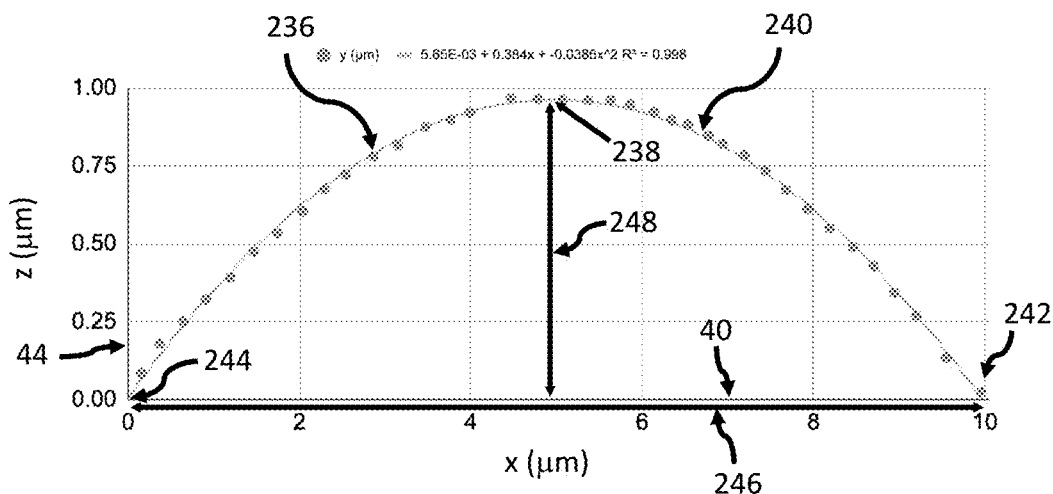
FIG. 16 is a graphical plot of a parabolic approximation of the curved line in FIG. 15.

FIG. 16 shows a graphical plot of curved line 236 (as circular markers). A curve-fit was conducted on the curved line 236 and it was found that the curved line was approximated very well by a parabolic function of the form: $z=ax^2+bx+c$, where x is displacement along the X-axis 40, z is displacement along the Z-axis 44, and a, b, and c are respective constants. Displacement is expressed in μm. The following values were calculated for the respective constants: a=−0.0386 μm-2, b=0.384 μm$^{-1}$, and c=5.65×10$^{-3}$ μm. The coefficient of determination $R^2$ was determined to be 0.998. Generally, the coefficient of determination $R^2$ is expected to be in a range of 0.95 to 1.0. Preferably, $R^2$ is in a range of 0.98 to 1.0. Preferably, $R^2$ is in a range of 0.99 to 1.0. Line 240 is a parabolic line defined by these respective values for the constants a, b, and c. It is possible to measure the X-axis and Z-axis coordinates from an arbitrarily selected origin. However, in the examples discussed in FIGS. 16 (microdot 230), 19 (microdot 250), and 23 (line 270), the origin was chosen to position the respective left endpoint (244 in FIG. 16, 264 in FIGS. 19, and 304 in FIG. 23) at or near the origin. In these examples, the right endpoints (242 in FIG. 16, 262 in FIGS. 19, and 302 in FIG. 23) were positioned near z=0. If the left endpoint is positioned sufficiently close to the origin such that the constant c is sufficiently small (preferably, c is in a range of −0.5× 10$^{-2}$ μm to 0.5×10$^{-2}$ μm, or more preferably c is in a range of −1×10$^{-2}$ μm to 1×10$^{-2}$ μm), then the width of the parabolic shape (along the X-axis) can be approximated as w=−b/a, a height of the parabolic shape (along the Z-axis) can be approximated as h=−b$^2$/(4a), and an aspect ratio AR, defined as height divided by width, can be approximated as AR=b/4. As shown in FIG. 16, the microdot width 246 is the distance (along X-axis 40) between the two endpoints 242, 244 and the microdot height 248 is the distance (along Z-axis) between the peak 238 and the substrate line 234 (approximately corresponding to z=0 line). In this example, the following quantities are calculated: w=9.9 h=0.96 μm, and AR=0.096. With changes in process conditions (e.g., lowering the viscosity of the metallic nanoparticle composition), it should be possible to achieve aspect ratios as low as 0.05 in metallic nanoparticle microdots and elongate metallic nanoparticle features.

Figure 17:
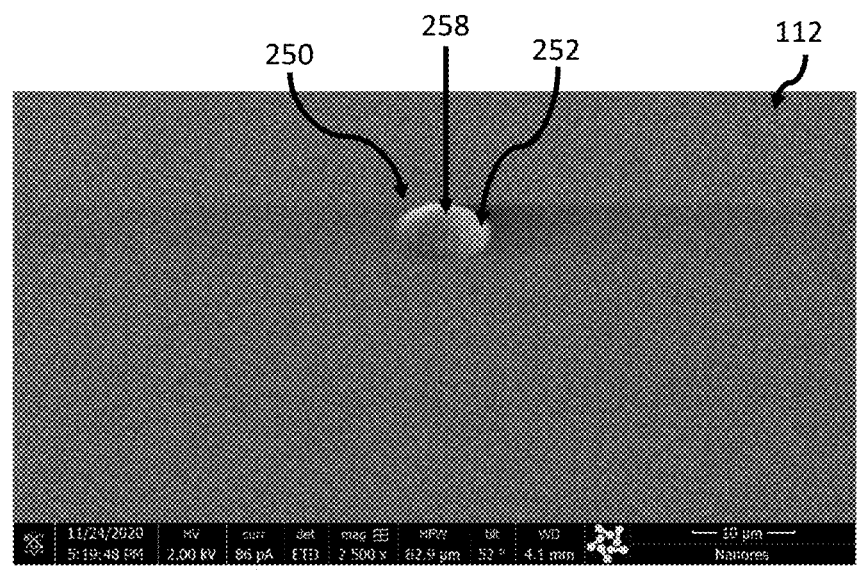
FIG. 17 is an SEM image of a second metallic nanoparticle microdot.

FIG. 17 is an SEM image of a metallic nanoparticle microdot 250, formed from the silver nanoparticle composition of Example 1. Microdot 250 has been formed on printable surface 112 of substrate 110. In this example, the substrate 110 is a bare glass substrate. Microdot 250 is bounded below by the printable surface 112 and bounded above by a curved surface 252. Curved surface 252 has a peak 258. Method 50 was used to form microdot 250, with the optional step 62 omitted (no lifting of the capillary tube relative to the substrate by a height increment of Δh while continuing to extrude the metallic nanoparticle composition from the outlet). The following conditions were used: capillary tube outlet outer diameter: 3.5 μm, pressure applied to the metallic nanoparticle composition: 9 bar, first height $h^1$ above the zero-height position: 1 μm, and time duration of extrusion at step 60: 15 sec.

Figure 18:
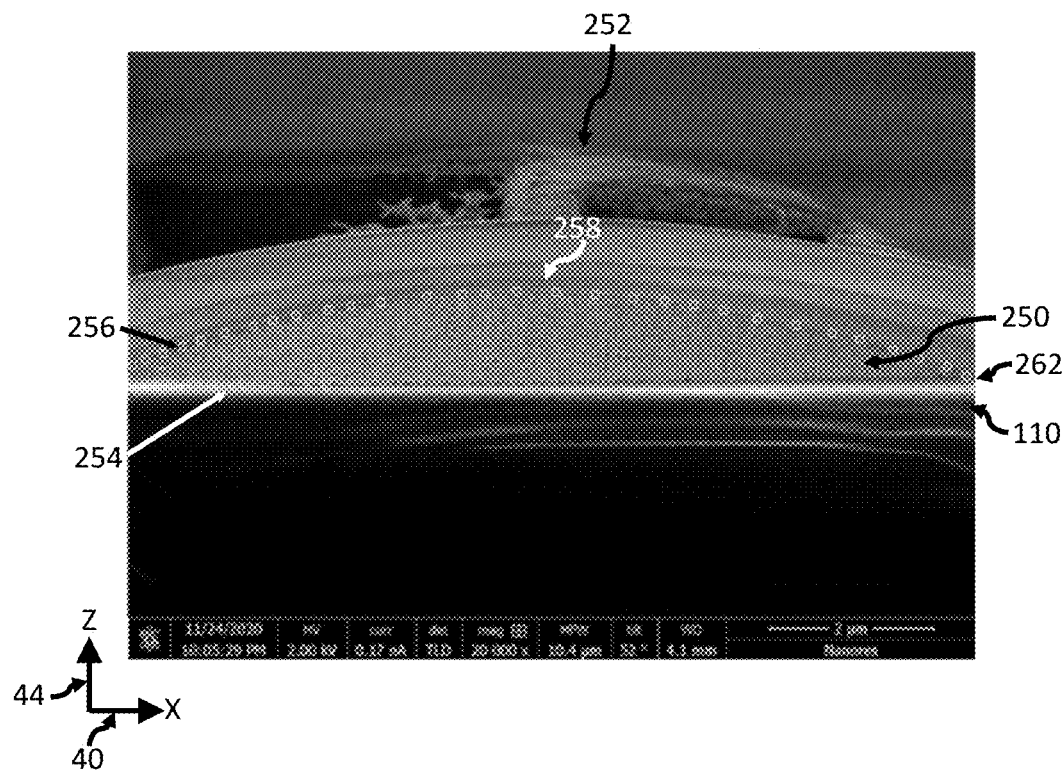
FIG. 18 is an SEM image of a cross section of the second metallic nanoparticle microdot of FIG. 17.

FIG. 18 is an SEM image of a cross section of the metallic nanoparticle microdot 250. Microdot 250 has been formed on substrate 110, which is a glass substrate in this example. The substrate extends principally along an X-axis 40 and a Y-axis perpendicular to the X-axis. The curved surface 252 protrudes away from the substrate along the Z-axis 44. The cross section has been chosen to include the peak 258 of the curved surface 252. In the cross-sectional image of FIG. 18, a line 254 contained in the substrate surface 112 and a curved line 256 contained in the curved surface 252 are visible. The curved line 256 traverses the peak 258. The X-axis 40 and the Y-axis have been chosen such that the curved line 256 extends along the X-axis and the Z-axis. In the background of the image of FIG. 18, a portion of the curved surface 252 is visible. Curved line 256 has been marked by circular marks that are used in a curve-fit shown in FIG. 19. The curved surface 252 intersects the substrate surface 112 (FIG. 17). The curved line 256 intersects the substrate surface 112 (substrate line 254) at endpoints 262 and 264 (FIGS. 18, 19).

Figure 19:
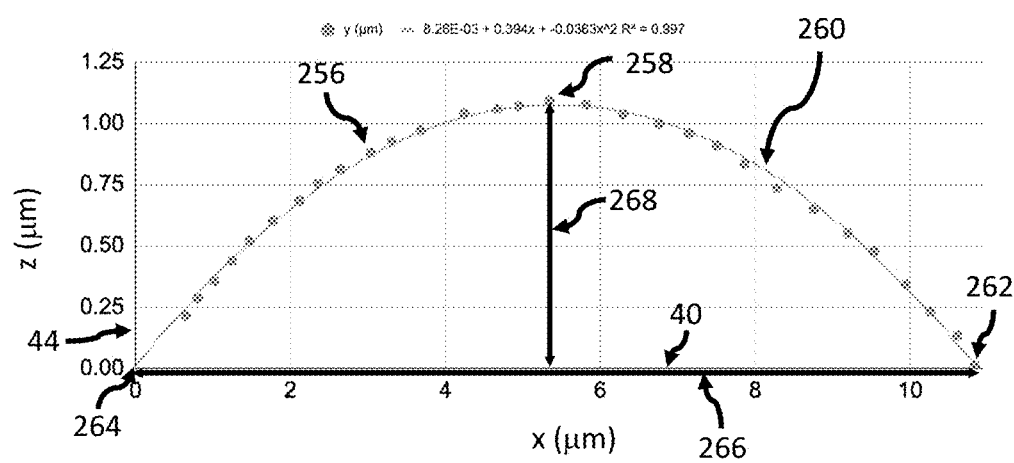
FIG. 19 is a graphical plot of a parabolic approximation of the curved line in FIG. 18.

FIG. 19 shows a graphical plot of curved line 256 (as circular markers). A curve-fit was conducted on the curved line 256 and it was found that the curved line was approximated very well by a parabolic function of the form: $z=ax^2+bx+c$, where x is displacement along the X-axis 40, z is displacement along the Z-axis 44, and a, b, and c are respective constants. Displacement is expressed in μm. The following values were calculated for the respective constants: $a=-0.0363$ μm$^{-2}$, $b=0.394$ μm$^{-1}$, and $c=8.26\times10^{-3}$ μm. The coefficient of determination $R^2$ was determined to be 0.997. Line 260 is a parabolic line defined by these respective values for the constants a, b, and c. As shown in FIG. 19, the microdot width 266 is the distance (along X-axis 40) between the two endpoints 262, 264 and the height 268 is the distance (along Z-axis) between the peak 258 and the substrate line 254 (approximately corresponding to z=0 line). In this example, the following quantities are calculated: w=10.9 h=1.07 μm, and AR=0.099.

Figure 24:
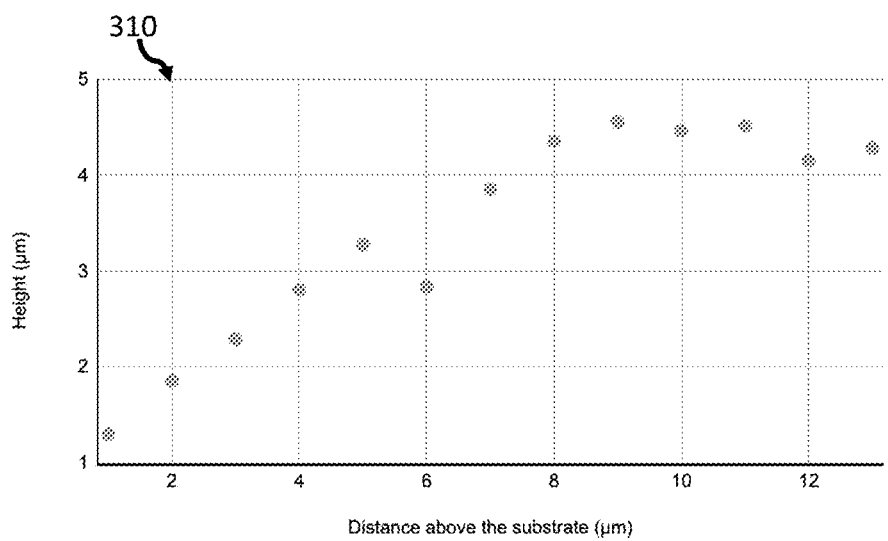
FIG. 24 is a graphical plot of heights of metallic nanoparticle microdots as a function of a final height of the outlet of the capillary tube above a substrate.
Figure 25:
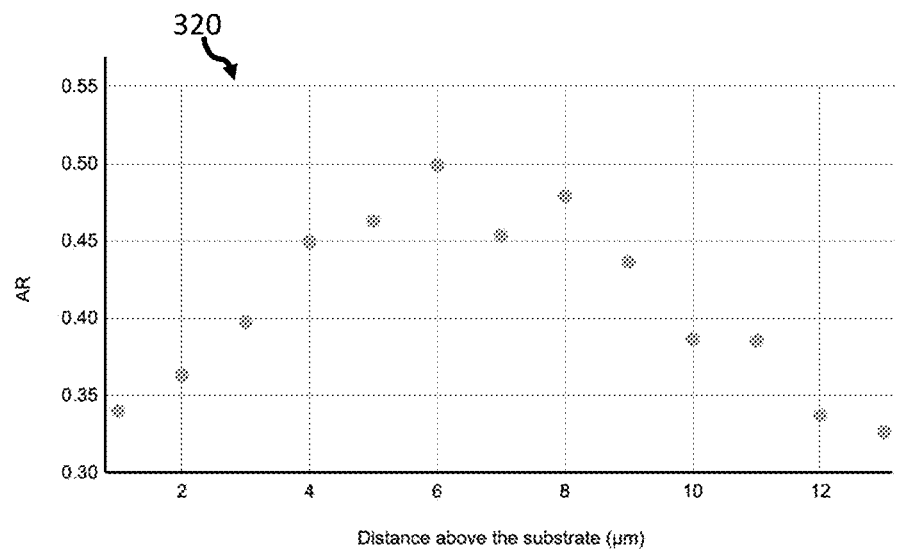
FIG. 25 is a graphical plot of aspect ratios of metallic nanoparticle microdots as a function of a final height of the outlet of the capillary tube above a substrate.

FIGS. 24 and 25 are graphical plots of data measured from metallic nanoparticle microdots as a function of a final height of the outlet of the capillary tube above the substrate. The microdots were formed from the silver nanoparticle composition of Example 1 on a bare glass substrate. Method 50, including optional step 62 (lifting of the capillary tube relative to the substrate by a height increment of Dh while continuing to extrude the metallic nanoparticle composition from the outlet) was used to form the microdots. The following conditions were used: capillary tube outlet outer diameter: 3.5 μm, pressure applied to the metallic nanoparticle composition: 7 bar, first height h1 above the zero-height position: 1 μm, height increment Dh: 1 μm. The final heights are the heights of the capillary tube outlet above the substrate at which step 64 (rapidly lifting the capillary tube to separate the outlet from the fluid bridge) is carried out. For each microdot, step 62 was repeated until the final height was reached. The final heights shown in FIGS. 24 and 25 range between 1 μm and 13 μm. For example, for a final height of 3 μm, step 62 is carried out twice: (1) lifting from a height of 1 μm to 2 μm, and (2) lifting from a height of 2 μm to 3 μm. A time duration of step 60 was set at 3 sec and a time duration of each duration of step 62 was set at 3 sec.

FIG. 24 is a graphical plot 310 of heights of metallic nanoparticle microdots as a function of a final height of the outlet of the capillary tube above the substrate. The heights of the microdots were measured using a surface profilometer. FIG. 25 is a graphical plot 320 of aspect ratios of metallic nanoparticle microdots as a function of a final height of the outlet of the capillary tube above the substrate. The aspect ratio of a microdot is defined as the height of the microdot divided by the diameter (width) of the microdot. The heights and widths of the microdots were measured using a surface profilometer. The microdot heights ranged between 1.3 μm (at a final height of 1 μm) and 4.56 μm (at a final height of 9 μm) (FIG. 24). For smaller final outlet heights, in a range of 1 μm to 5 μm, the microdot heights increased with increasing final outlet heights. The microdot heights appear to saturate in a range of 4.1 μm to 4.6 μm for final outlet heights of 8 μm and greater. The microdot diameters (widths) ranged between 3.82 μm (at a final outlet height of 1 μm) and 13.14 μm (at a final outlet height of 13 μm). Generally, the microdot diameters increased with increasing final outlet heights. The microdot aspect ratio reaches a peak of 0.5 at a final height of 6 μm (diameter 5.69 μm, height 2.84 μm). The microdot aspect ratios are lower for final heights of 8 μm and greater because the diameters are larger for these final heights (9.1 μm diameter at final height of 8 μm and 13.14 μm diameter at final height of 13 μm) and the microdot heights are saturated. With changes in process conditions (e.g., increasing the viscosity of the metallic nanoparticle composition), it should be possible to achieve microdot aspect ratios greater than 0.5 and microdot heights greater than 4.5 μm. Microdot heights as large as 10 μm should be possible. On the other hand, if the metallic nanoparticles have diameters of less than 100 nm, a minimum microdot height can be 0.1 μm. Accordingly, heights of metallic nanoparticle microdots can be in a range of 0.1 μm to 10 μm. Similarly, heights of elongate metallic nanoparticle features can be in a range of 0.1 μm to 10 μm.

Figure 26:
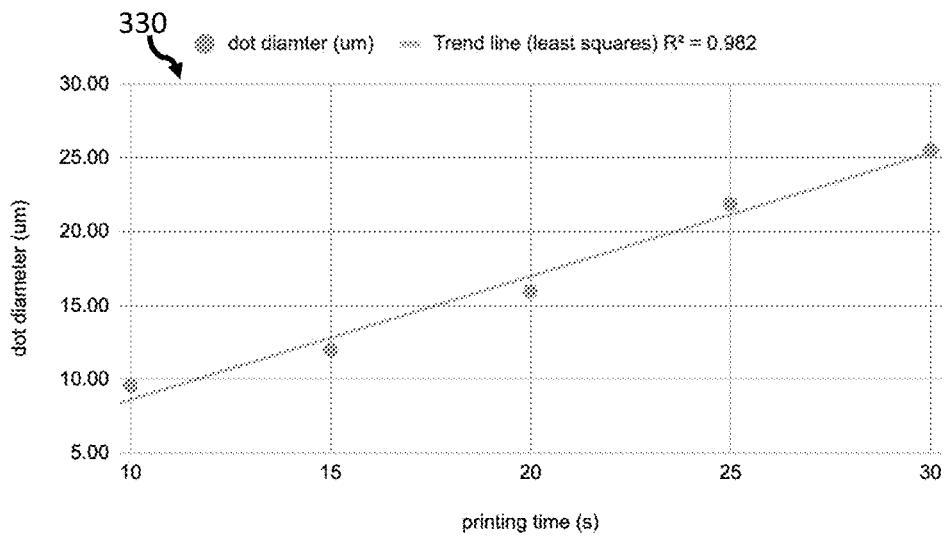
FIG. 26 is a graphical plot of diameters (widths) of metallic nanoparticle microdots as a function of time duration of extrusion.

FIG. 26 is a graphical plot 330 of diameters of metallic nanoparticle microdots as a function of a time duration of extrusion at step 60. The microdots were formed from the silver nanoparticle composition of Example 1 on a bare glass substrate. Method 50 was used to form the microdots, with optional step 62 omitted (no lifting of the capillary tube relative to the substrate by a height increment of Δh while continuing to extrude the metallic nanoparticle composition from the outlet). The following conditions were used: capillary tube outlet outer diameter: 3.5 μm, pressure applied to the metallic nanoparticle composition: 9 bar, first height $h_1$ above the zero-height position: 5 μm. The microdot diameter (width) increases monotonically from 9.57 μm for extrusion time duration of 10 sec to 25.51 μm for extrusion time duration of 30 sec.

Figure 23:
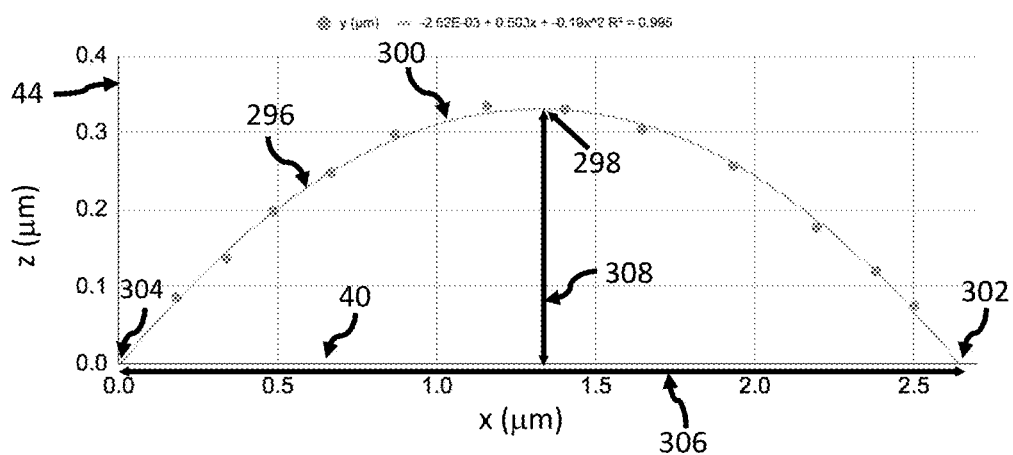
FIG. 23 is a graphical plot of a parabolic approximation of the curved line in FIG. 22.

It should be possible to form microdots as small as 1 μm in diameter by using a suitable combination of capillary tubes of outlet outer diameter smaller than 3.5 μm and extrusion times shorter than 10 sec. For example, in the case of lines, a line width of 2.6 μm was achieved using a capillary tube of outlet outer diameter 1.5 μm (FIG. 23). It should be possible to form microdots as large as 50 μm in diameter by using a suitable combination of capillary tubes of outlet outer diameter greater than 3.5 μm and extrusion times longer than 30 sec. Metallic nanoparticle microdots with widths in a range of 1 μm to 50 μm should be possible. Similarly, elongate metallic nanoparticle features with line widths in a range of 1 μm to 50 μm should be possible.

Figure 27:
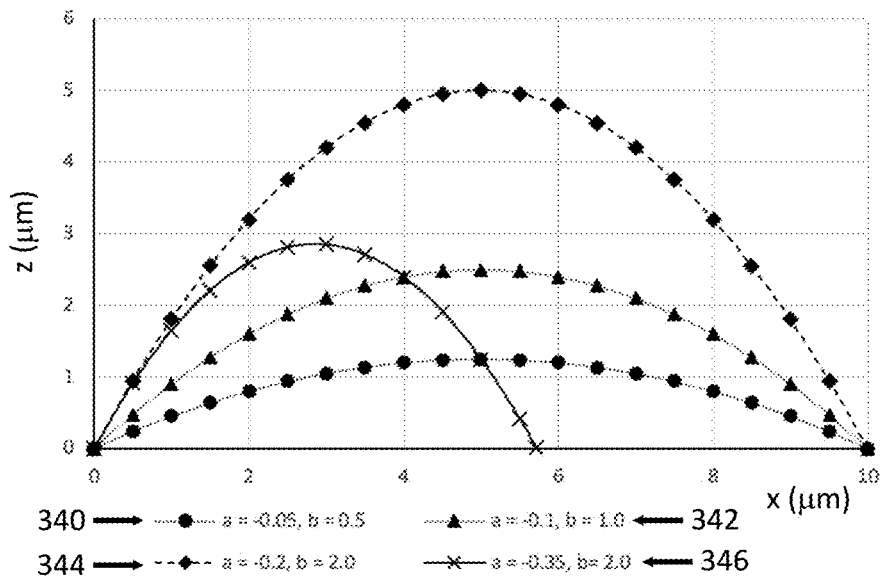
FIG. 27 shows illustrative parabolic lines defined by certain values of constants.

FIG. 27 shows selected illustrative parabolic lines defined by certain values of constants a and b. In these graphical plots, the constant c is set to zero. FIG. 27 shows the following: parabolic line 340 (circles, a=−0.05, b=0.5, w=10 μm, h=1.25 μm, AR=0.125), parabolic line 342 (triangles, a=−0.1, b=1.0, w=10 μm, h=2.5 μm, AR=0.25), parabolic line 344 (diamonds, a=−0.2, b=2.0, w=10 μm, h=5.0 μm, AR=0.5), and parabolic line 346 (x's, a=−0.35, b=2.0, w=5.714 μm, h=2.857 μm, AR=0.5). If feasible aspect ratios (AR) are in a range of 0.05 to 1, possible values of constant b would be in a range of 0.2 μm-1 to 4 μm-1 for microdots and lines. If the microdot widths or line widths are in a range of 1 μm to 50 μm, then the values of the ratio −b/a would be in a range of 1 μm to 50 μm. In accordance with the constraints on the values of aspect ratios, microdot heights or line heights, and microdot widths or line widths, the values of a would be in a range of −4 μm$^{-2}$ to −0.01 μm$^{-2}$.

Method 70 of FIG. 3 is an additive method of forming an elongate metallic nanoparticle feature on a substrate. Method 70 includes steps 52, 54, 56, 58, 72, 64, 76, and 68. Steps 52, 54, 56, 58, 64, and 68 have been described with reference to method 50 (FIG. 2). At step 52, a metallic nanoparticle composition is prepared. At step 54, a printing apparatus (printer) is prepared for use. At step 56, a position of the outlet 132 of the capillary tube 120 at zero height above the substrate (zero-height position) is estimated or obtained.

Figure 13:
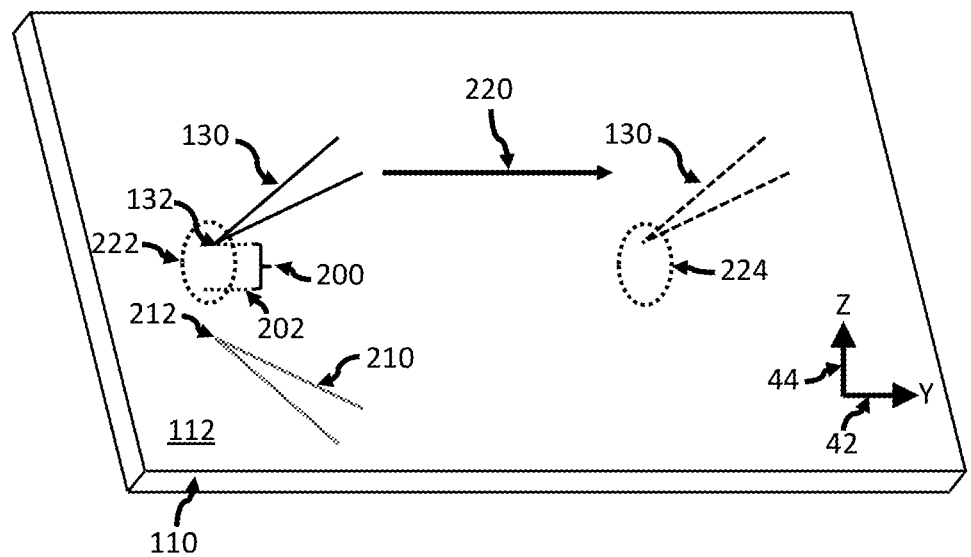
FIG. 13 is a schematic perspective view of an implementation of an additive method of forming an elongate metallic nanoparticle feature on a substrate.

FIG. 13 shows a perspective view of the tapering portion 130 and the outlet 132 of a capillary tube, suspended above a substrate 110. The two views 206, 208 correspond to different times. For ease of illustration, only a small portion of the tapering portion is shown. In this implementation, the tapering portion 130 (the capillary tube 120) is tilted at an oblique angle relative to a vertical axis (Z-axis 44). In view 206, the outlet 132 (tip of the capillary tube) is at a height 200 above zero-height position 202.

At step 58, the capillary tube 120 (more specifically, the outlet 132) is displaced to a start position. FIG. 13 shows a view of a tapering portion 130 and an outlet 132 of a capillary tube at a start position 222, which is a lateral position expressed in X-coordinates and Y-coordinates. At the start position 222, the outlet 132 is at a first height $h_1$ (200). At step 72, the metallic nanoparticle composition is extruded from the outlet while laterally displacing the capillary tube is laterally displaced along a trajectory (220) on the substrate from a start position 222 to an end position 224. The height of the outlet above the substrate is at the first height $h_1$ (200) at the start position but the height may change as the capillary tube is displaced to the end position 224. This may occur, for example, if the capillary tube traverses existing microscopic steps or other existing features. The height of the outlet above the substrate may stay approximately constant during step 72. Step 72 includes forming and maintaining a fluid bridge (a bridge of the metallic nanoparticle composition) between the outlet 132 and the substrate 110. Accordingly, the first height $h_1$ should be chosen to be sufficiently short such that a fluid bridge spanning the outlet 132 and the substrate 110 can be formed. Under typical conditions, the first height $h_1$ can be in a range of 1 μm to 10 μm. The pressure applied to the metallic nanoparticle composition in the dispenser is preferably in a range of 0 bar to 10 bar. No electric fields need to be applied to the nanoparticle composition to carry out this extrusion.

At step 64, the capillary tube is rapidly lifted to separate the outlet from the fluid bridge. The extrusion of metallic nanoparticle composition to the elongate feature is complete upon the separation of the outlet from the fluid bridge. Steps 58, 72, and 64 are repeated until all of the desired elongate features have been formed on the substrate (decision step 76). At step 68, the workpiece is sintered.

Figure 20:
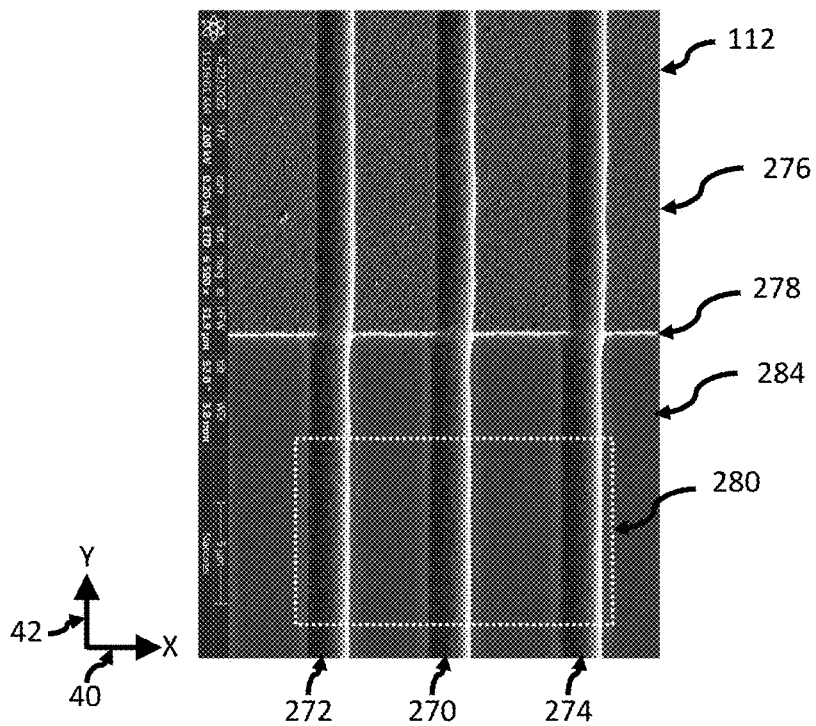
FIGS. 20 and 21 are SEM images of metallic nanoparticle lines.

FIG. 20 is an SEM image of metallic nanoparticle lines 270, 272, and 274, formed from the silver nanoparticle composition of Example 1. Metallic nanoparticle lines are examples of elongate metallic nanoparticle features. Lines 270, 272, and 274 have been formed on printable surface 112. The substrate extends principally along an X-axis 40 and a Y-axis 42 perpendicular to the X-axis. The lines 270, 272, and 274 extend longitudinally along the Y-axis 42. In this example, the printable surface has two portions: a higher surface portion 276 and a lower surface portion 286. Surface portion 276 is aluminum (Al) and surface portion 284 is silicon nitride ($SiN_x$). There is a microscopic step 278 down from surface portion 276 to surface portion 284. A height of the microscopic step 278 is approximately 370 nm. The lines 270, 272, and 274 traverse the microscopic step without any breakage. Method 70 was used to form lines 270, 272, and 274. The following conditions were used: capillary tube outlet outer diameter: 1.5 μm, pressure applied to the metallic nanoparticle composition: 10 bar, first height $h_1$ above the zero-height position: 1 μm, and speed of lateral displacement at step 72: 0.05 mm/sec. For each of the lines, the start position was in the higher surface portion 276 and the end position was in the lower surface portion 284.

Figure 21:
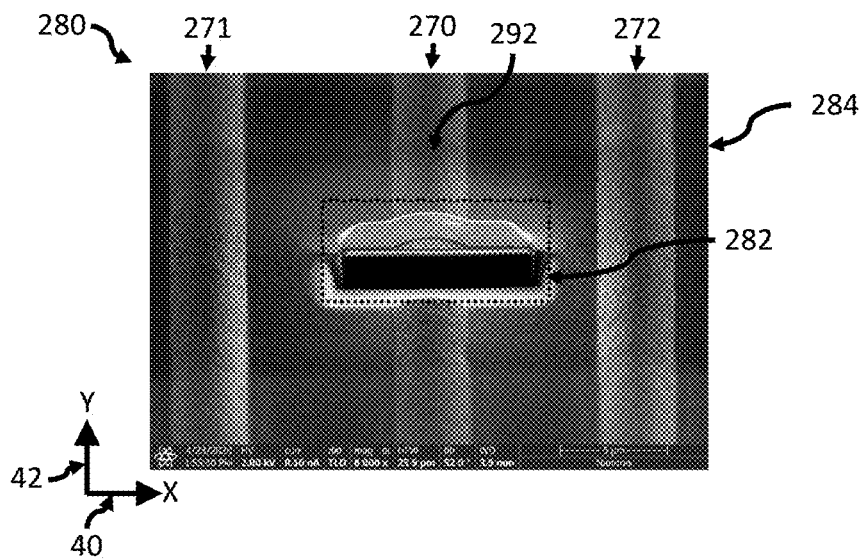
Figure 22:
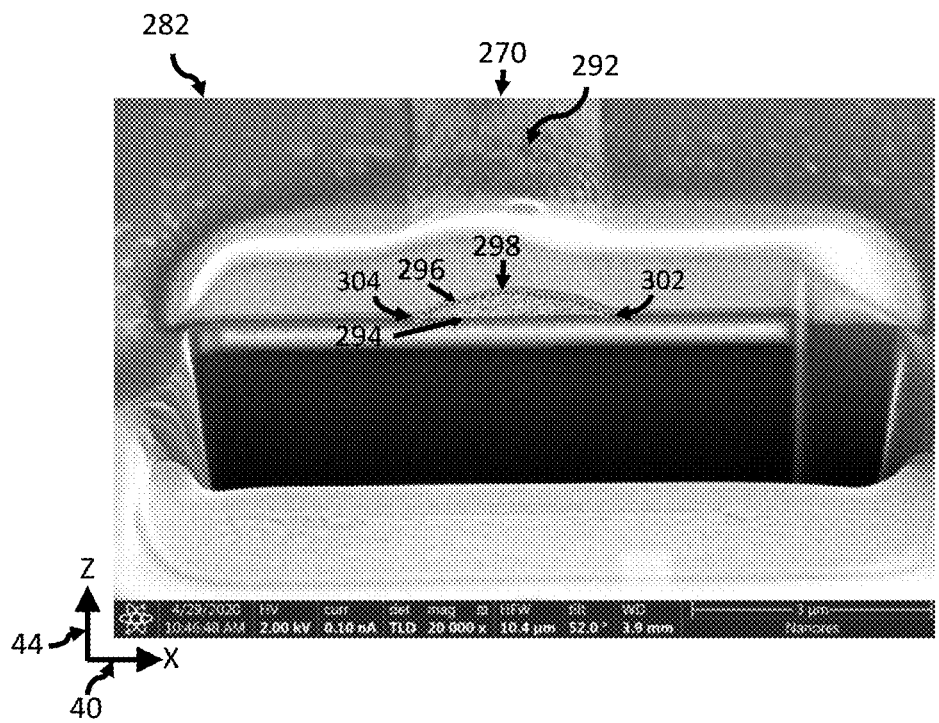
FIG. 22 is an SEM image of a cross section of one of the metallic nanoparticle lines of FIGS. 20 and 21.

FIG. 21 is an SEM image of a portion 280 of the workpiece (FIG. 20). In this portion 280, the lines 270, 272, and 274 are on a silicon nitride surface. In the portion 280 shown in FIG. 21, the line 270 is bounded below by substrate surface 284 and bounded above by a curved surface 292. In the portion 280 shown in FIG. 21, curved surface 292 extends longitudinally along the Y-axis 42. A cross section 282 of line 270 was obtained as shown in FIG. 21. FIG. 22 is an SEM image of the cross section 282 of the metallic nanoparticle line 270. The curved surface 292 protrudes away from the substrate along the Z-axis 44. In the cross-sectional image of FIG. 22, a line 294 contained in the substrate surface 284 and a curved line 296 contained in the curved surface 292 are visible. The cross section 282 has been chosen to be transverse to the longitudinal direction (Y-axis 42) along which the curved surface 292 extends. Accordingly, the curved line 296 extends along the X-axis 40 and the Z-axis 44. The curved surface 292 intersects the substrate surface 284 (FIG. 21). The curved line 296 intersects the substrate surface 284 (or substrate line 294) at two endpoints 302, 304 (FIGS. 22, 23). In the background of the image of FIG. 22, a portion of the curved surface 292 is visible. The curved line 296 traverses its peak 298. Curved line 296 has been marked by circular marks that are used in a curve-fit shown in FIG. 23.

FIG. 23 shows a graphical plot of curved line 296 (as circular markers). A curve-fit was conducted on the curved line 296 and it was found that the curved line was approximated very well by a parabolic function of the form: $z=ax^2+bx+c$, where x is displacement along the X-axis 40, z is displacement along the Z-axis, and a, b, and c are respective constants. Displacement is expressed in μm. The following values were calculated for the respective constants: $a=-0.19$ $nm^{-2}$, $b=0.503$ $\mu m^{-1}$, and $c=-2.62\times10^{-3}$ μm. The coefficient of determination $R^2$ was determined to be 0.995. Line 300 is a parabolic line defined by these respective values for the constants a, b, and c. As shown in FIG. 23, the line width 306 is the distance (along X-axis 40) between the two endpoints 302, 3044 and the height 308 is the distance (along Z-axis) between the peak 298 and the substrate line 294 (approximately corresponding to z=0 line). In this example, the following quantities are calculated: w=2.6 h=0.33 μm, and AR=0.126.

Metallic nanoparticle microdots and features having parabolic profiles are significant in that there are no sharp edges. Methods of forming these metallic nanoparticle microdots and features are additive manufacturing methods. Subtractive manufacturing methods such as photolithography and nanoimprint lithography are available but conventional features that are formed using these subtractive manufacturing methods do not have parabolic surfaces. Conventional features that are formed using subtractive manufacturing methods have sharper edges or sidewalls that are closer to vertical. Accordingly, there are frequently difficulties in forming subsequent conformal coatings over conventional features without breakage. The development of these metallic nanoparticle microdots and features will enable higher throughput manufacturing of multi-layer conductive features in the semiconductor and optoelectronics applications.

EXAMPLES

Example 1: Silver Nanoparticle Paste Composition (85 wt %) in Triethylene Glycol, Including Dispersing Agent 2 wt %

Reagents:

AgNO3—12.5 g

PVP (K30 grade)—100.1 g

Ethylene glycol—560 ml

Acetone—1520 ml

Ethanol 96%—300 ml

Triethylene glycol—1.326 ml

Dispersing agent, alkylammonium salt of a copolymer with acidic groups—235.2 µl

1) Synthesis

Two synthesis reactions were done in parallel. For each synthesis reaction: AgNO3 (12.5 g) was dissolved in 50 ml of Ethylene Glycol at room temperature. In a three-necked flask, PVP (100.2 g) was dissolved in 250 ml of Ethylene Glycol, under reflux, while heating at 140° C. AgNO3 solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification

Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 58.8 µl dispersing agent (for each of 4 bottles of the double synthesis) under sonication and shaking (10 min).

3) Formulation

Approximately 120 ml of obtained dispersion were transferred into a syringe and filtered through 1.0 µm PA filter directly into round-bottom flask. 1.326 ml of triethylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 µm PVDF filter directly into 5 ml PE syringe (filled from top). Obtained dispersion is estimated to have a solid content concentration of 85 wt %±2 wt % (based on TGA measurement). Silver content is estimated to be in a range of 79 wt % to 83 wt (based on ICP or AAS measurement). The concentration of the dispersing agent in the composition is estimated to be approximately 2 wt %.

What is claimed is:

1. An additive method of forming a metallic nanoparticle microdot on a substrate, comprising:
   (A) estimating or obtaining a position of an outlet of a capillary tube at zero height above the substrate (zero-height position);
   (B) extruding a metallic nanoparticle composition from the outlet at a first height $h_1$ above the zero-height position, comprising forming a fluid bridge between the outlet and the substrate;
   (C) lifting the capillary tube relative to the substrate slowly enough that the fluid bridge remains intact by a height increment of Δh while continuing to extrude the metallic nanoparticle composition from the outlet; and
   (D) rapidly lifting the capillary tube relative to the substrate to separate the outlet from the fluid bridge, wherein the step (D) is more rapid than the step (C).

2. The method of claim 1, wherein the first height is in a range of 1 µm to 10 µm.

3. The method of claim 1, wherein the height increment Δh is in a range of 1 µm to 15 µm.

4. The method of claim 1, wherein the outlet of the capillary tube has an outer diameter in a range of 0.7 µm to 8 µm.

5. The method of claim 1, wherein the capillary tube is a glass capillary tube.

6. The method of claim 1, wherein a pressure is applied to the metallic nanoparticle composition during the extruding at step (B) and step (C), the pressure being in a range of 0 bar to 10 bar.

7. The method of claim 1, wherein a concentration of metals in the metallic nanoparticle composition is in a range of 60 wt % to 90 wt %.

8. The method of claim 7, wherein the concentration of metals in the metallic nanoparticle composition is in a range of 76 wt % to 84 wt %.

9. The method of claim 1, wherein the metallic nanoparticle composition comprises silver nanoparticles or copper nanoparticles.

10. The method of claim 1, wherein the metallic nanoparticle composition comprises a non-aqueous polar protic solvent having two hydroxyl groups, a boiling point of at least 280° C. at 760 mm Hg, and a viscosity in a range of 45 cP to 65 cP at 20° C.

11. The method of claim 1, wherein the non-aqueous polar protic solvent is selected from: triethylene glycol and tetraethylene glycol.

12. An additive method of forming an elongate metallic nanoparticle feature on a substrate, comprising:
    (A) estimating or obtaining a position of an outlet of a capillary tube at zero height above the substrate (zero-height position);
    (B) extruding a metallic nanoparticle composition from the outlet while laterally displacing the capillary tube along a trajectory on the substrate from a start position to an end position, the outlet being at a first height $h_1$ above the zero-height position at the start position, comprising forming and maintaining a fluid bridge between the outlet and the substrate; and
    (C) rapidly lifting the capillary tube to separate the outlet from the fluid bridge.

13. The method of claim 12, wherein the first height is in a range of 1 µm to 10 µm.

14. The method of claim 12, wherein the height increment Δh is in a range of 1 µm to 15 µm.

15. The method of claim 12, wherein the outlet of the capillary tube has an outer diameter in a range of 0.7 μm to 8 μm.

16. The method of claim 12, wherein the capillary tube is a glass capillary tube.

17. The method of claim 12, wherein a pressure is applied to the metallic nanoparticle composition during the extruding at step (B), the pressure being in a range of 0 bar to 10 bar.

18. The method of claim 12, wherein a concentration of metals in the metallic nanoparticle composition is in a range of 60 wt % to 90 wt %.

19. The method of claim 18, wherein the concentration of metals in the metallic nanoparticle composition is in a range of 76 wt % to 84 wt %.

20. The method of claim 12, wherein the metallic nanoparticle composition comprises silver nanoparticles or copper nanoparticles.

21. The method of claim 12, wherein the metallic nanoparticle composition comprises a non-aqueous polar protic solvent having two hydroxyl groups, a boiling point of at least 280° C. at 760 mm Hg, and a viscosity in a range of 45 cP to 65 cP at 20° C.

22. The method of claim 12, wherein the non-aqueous polar protic solvent is selected from: triethylene glycol and tetraethylene glycol.

* * * * *